United States Patent [19]

Suzuki et al.

[11] Patent Number: 4,967,227
[45] Date of Patent: Oct. 30, 1990

[54] COLOR IMAGE RECORDING APPARATUS WITH MASK MEMBER REGISTERING MECHANISM

[75] Inventors: Makoto Suzuki; Toshio Sakai; Tomoaki Hattori, all of Nagoya; Izumi Takagi, Kuwana, all of Japan

[73] Assignee: Brother Kogyo Kabushiki Kaisha, Aichi, Japan

[21] Appl. No.: 405,434

[22] Filed: Sep. 11, 1989

[30] Foreign Application Priority Data

| Sep. 9, 1988 | [JP] | Japan | 63-226783 |
| Sep. 28, 1988 | [JP] | Japan | 63-243234 |
| Sep. 28, 1988 | [JP] | Japan | 63-243235 |
| Sep. 28, 1988 | [JP] | Japan | 63-243236 |
| Oct. 4, 1988 | [JP] | Japan | 63-248976 |
| Oct. 6, 1988 | [JP] | Japan | 63-252262 |
| Oct. 18, 1988 | [JP] | Japan | 63-262436 |
| Oct. 21, 1988 | [JP] | Japan | 63-265637 |

[51] Int. Cl.$^5$ .................. G03B 27/32; G03B 27/52
[52] U.S. Cl. ........................................ 355/32; 355/88; 355/27
[58] Field of Search .................. 355/27, 32, 106, 88, 355/327

[56] References Cited

U.S. PATENT DOCUMENTS

| 4,147,428 | 4/1979 | Nishikawa et al. | 355/88 |
| 4,264,192 | 4/1981 | Robb | 355/32 |
| 4,325,631 | 4/1982 | McCullion | 355/32 |
| 4,385,828 | 5/1983 | Prentice | 355/32 |
| 4,626,097 | 12/1986 | Uchida | 355/32 |
| 4,821,078 | 4/1989 | Nishida et al. | 355/88 |

*Primary Examiner*—Monroe H. Hayes
*Attorney, Agent, or Firm*—Oliff & Berridge

[57] ABSTRACT

A color image recording device for forming a mask member having a positioning mask thereon and exposing a photosensitive medium through the mask member to light to form a color image on the photosensitive medium, comprising belt for carrying the mask member thereon, two belt supporting rollers spaced at an interval and independently movable in a feeding direction of the mask member and in a vertical direction thereto, stepping motors for moving the belt supporting rollers, a sensor for detecting the position of the positioning mark and a control unit for controlling the stepping motors to register the mask member. According to one aspect of this invention, the stepping motors are controlled by the control unit to change a feeding speed of the mask member at two or more stages in accordance with an output signal from the sensor by switching the excited phases of the stepping motors or by changing an electric power supplied to at least one of the stepping motors.

18 Claims, 17 Drawing Sheets

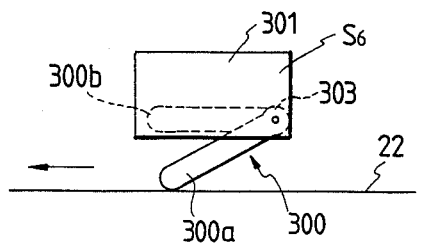
FIG. 22
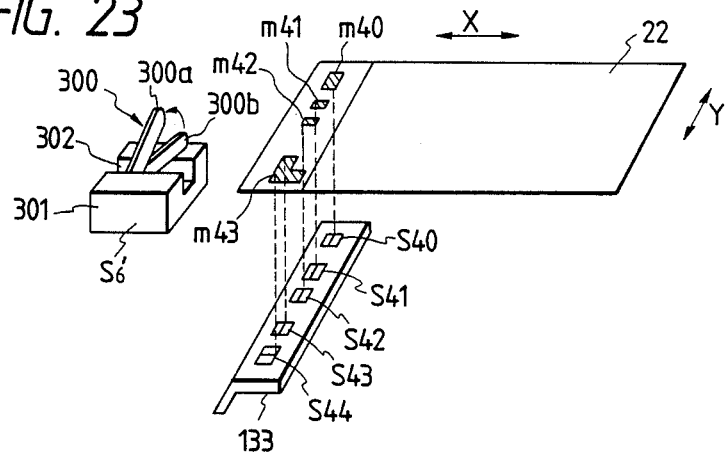
FIG. 23
FIG. 24
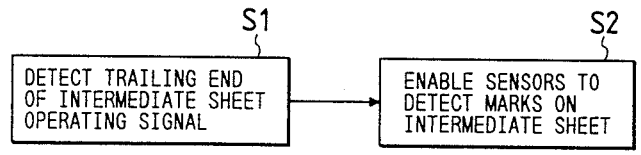
FIG. 25
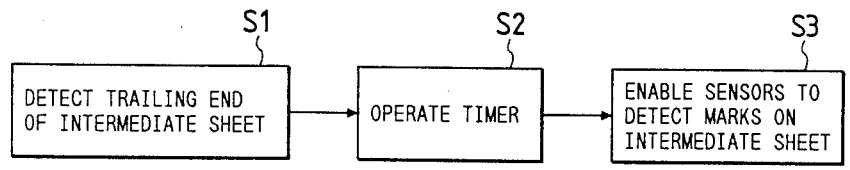

COLOR IMAGE RECORDING APPARATUS WITH MASK MEMBER REGISTERING MECHANISM

BACKGROUND OF THE INVENTION

The present invention relates to a color image recording apparatus for exposing a photosensitive recording medium through mask members, and more particularly to a color image recording apparatus having a registering mechanism for registering mask members.

There is known as color image recording apparatus in which mask members or intermediate sheets corresponding to three primaries are produced by a monochromatic printer and electrostatically carried by a feed belt into an exposure unit in which a color latent image is formed on a photosensitive recording medium by exposure through the mask members. It is highly important that the mask members on the feed belt be accurately registered in the exposure unit in order to expose the photosensitive recording medium to three primary images which are superposed precisely for thereby producing a colored image of high quality. Therefore, there has been a demand for a registering mechanism for registering the mask members with high accuracy.

The applicant has proposed an apparatus employing a novel registering mechanism for superposing three primary images precisely on a photosensitive recording medium and exposing the photosensitive recording medium to the three primary images, as disclosed in U.S. patent application Ser. No. 07/255,342.

The disclosed apparatus comprises, in the gap between a light source and a photosensitive recording medium, a belt drive means for carrying and feeding mask members on a feed belt, two belt support moving means, i.e., front and rear end belt support moving means, for moving a belt support which supports the feed belt in a direction substantially normal to the direction in which the feed belt feed the mask members, and positioning sensors disposed in confronting relation to the feed belt, the positioning sensors serving to read positioning reference marks on each of the mask members.

Each of the mask members is fed by the feed belt to a position very close to the position where the photosensitive recording medium will be exposed, and then the positioning reference marks (which have been formed at the same time as the mask image) on the mask member are read by the positioning sensors. Based on signals from the positioning sensors, the belt drive means and the two belt support moving means are controlled by a control means so that any inclination or skew of the mask member with respect to the feeding direction and positional displacements of the mask member in the feeding direction and the direction normal thereto will be eliminated.

By employing the positioning reference marks on each of the mask members and the belt drive means and the two belt support moving means, which serve as a position correcting means, the three mask members can be registered more accurately and as a result the three primary images can be superposed more precisely for exposure, than a conventional positioning arrangement in which the mask members are positionally corrected by only a belt drive means through the detection of the leading edges of the mask members.

However, the control of operation of the feed belt which is used for registering the mask members in the earlier apparatus cannot be speeded up and is relatively inaccurate. More specifically, the stroke of each incremental step of a stepping motor which actuates the feed belt remains the same while the mask members are being fed and subsequently registered. Accordingly, if the stroke of each incremental step of the stepping motor is increased to speed up the feeding of the mask members, then the accuracy with which the mask members are registered is lowered. Conversely, if the stroke of each incremental step is reduced to achieve greater registering accuracy, then the speed at which the mask members are fed is lowered.

In the disclosed apparatus, the completion of a registering process is confirmed by determining whether the output signal from each of the positioning sensors has exceeded a threshold level or not. This arrangement cannot directly determine whether a mask member is positioned in a target position or not, i.e., it can determine only whether a mask member has moved past the target position or is still positioned before the target position. In order to stop a mask position exactly in the target position, a highly precise control procedure for de-energizing the belt drive means the instant the output signal from the positioning sensor exceeds the threshold level must be employed.

After a mask member has been registered in the feeding direction, for example, according to one of the positioning sensors, the mask member is corrected out of any skewed condition with respect to the feeding direction according to another positioning sensor. At this time, the mask member may be positionally displaced again in the feeding direction by being corrected out of the skewed condition. Such a positional displacement can on longer be detected if it occurs past the target position since, as described above, the positioning sensors can determine only whether a mask member has moved past the target position or is still positioned before the target position.

Therefore, each time a mask member is positionally corrected in the feeding direction or the direction normal thereto, or out of any skewed condition according to one of the positioning sensors, the mask member that has been corrected in the other directions has to be fed back and registered again in those other directions according to the other corresponding positioning sensors. Consequently, the entire process of completely correcting the mask members in all the directions is time-consuming.

The mask member registering process is composed of the step of correcting the position of a mask member in the feeding direction, the step of correcting the mask member out of e skewed condition, and the step of correcting the position of the mask member in the direction normal to the feeding direction. These correcting steps are successively carried out at different times As a result, it is time consuming to finish the entire registering process.

SUMMARY OF THE INVENTION

In view of the aforesaid drawbacks of the conventional color image recording apparatus, it is an object of the present invention to provide a color image recording apparatus having a registering mechanism for feeding mask members at a high speed into an exposure unit and registering mask members in the exposure unit highly accurately in a short period of time through a simple control process.

According to one aspect of the present invention, there is provided a color image recording device for forming a mask member having a positioning mark thereon on the basis of an input color image and exposing a photosensitive medium through the mask member to light to form a color image on the photosensitive medium, comprising belt means for carrying the mask member thereon belt moving means for supporting and moving the belt means, the belt moving means mounted in the color image recording device so as to be movable relative to the color image recording device, driving means for driving the belt moving means so that the belt means is movable in a feeding direction of the mask member and in a vertical direction to the feeding direction, the driving means comprising first motor means for registering the mask member in the feeding direction and second motor means for registering the mask member in the vertical direction to the feeding direction and correcting the inclination of the mask member to the feeding direction, position detecting means for detecting the positioning mark and outputting a signal representing the position of the mask member. and control means for controlling the driving means to change a feeding speed of the belt moving means at two or more stages in accordance with the signal from the position detecting means, so that the mask member is roughly fed at a high speed and is finely registered at a low speed.

According to another aspect of the invention, there is provided a color image recording device for forming a mask member having a positioning mark thereon on the basis of an input color image and exposing a photosensitive medium through the mask member to light to form a color image on the photosensitive medium, comprising belt means for carrying the mask member thereon, belt moving means for supporting and moving the belt means, the belt moving means mounted in the color image recording device so as to be movable relative to the color image recording device, driving means for driving the belt moving means so that the belt means is movable in a feeding direction of the mask member and in a vertical direction to the feeding direction, the driving means comprising first motor means for registering the mask member in the feeding direction and second motor means for registering the mask member in the vertical direction to the feeding direction and correcting the inclination of the mask member to the feeding direction, position detecting means for detecting the positioning mark and outputting a signal having a level indicative of the position of the mask member, and control means for judging the position of the mask member on the basis of the signal from the position detecting means and controlling the driving speed and driving direction in accordance with the result of judgement of the control means.

According to still another aspect of the invention, there is provided a color image recording device for forming a mask member having a positioning mark on the basis of an input color image and exposing a photosensitive medium through the mask member to light to form a color image on the photosensitive medium, comprising belt means for carrying the mask member thereon, belt moving means for supporting and moving the belt means, the belt moving means mounted in the color image recording device so as to be movable relative to the color image recording device, driving means for driving the belt moving means so that the belt means is movable in the feeding direction of the mask member and in the vertical direction to the feeding direction, position detecting means for detecting the positioning mark and outputting m signal indicative of the position of the mask member, and control means for controlling the driving means in accordance with the signal from the position detecting means to register the mask member, wherein the mask member is provided with first and second positioning marks at least at on end portion of the mask member and the other end portion thereof, respectively, and the position detecting means includes a first positioning sensor for detecting the first positioning mark and outputting a first analog signal indicative of the position of the first positioning mark and a second positioning sensor for detecting the second positioning mark and outputting a second analog signal indicative of the position of the second positioning mark.

According to further aspect of the invention, there is provided a color image recording device for forming a mask member having a positioning mark formed at the rear end portion thereof in a feeding direction of the mask member and exposing a photosensitive medium through the mask member to light to form a color image on the photosensitive medium, comprising belt means for carrying the mask member thereon, belt moving means for supporting and moving the belt means, the moving means mounted in the color image recording device so as to be movable relative to the color image recording device, driving means for driving the belt moving means so that the belt means is movable in the feeding direction of the mask member and in the vertical direction to the feeding direction, position detecting means for detecting the positioning mark and outputting a signal indicative of the position of the mask member, mask end detecting means provided at the upstream side of the feeding direction of the position detecting means for detecting the rear end of the mask member, and control means for controlling the position detecting means to start a position detecting operation of the position detecting means after the rear end of the mask member is detected by the mask end detecting means, and controlling the driving means in accordance with the signal from the position detecting means.

According to still further aspect of the invention, there is provided a color image recording device for forming a mask member having a positioning mark and exposing a photosensitive medium through the mask member to light to form a color image on the photosensitive medium, comprising belt means having an endless belt for carrying the mask member thereon, belt moving means for supporting and moving the belt means, the belt moving means mounted in the color image recording device so as to be movable relative to the color image recording device, driving means for driving the belt moving means so that the belt means is movable in the feeding direction of the mask member and in the vertical direction to the feeding direction, position detecting means for detecting the positioning mark and outputting a first signal indicative of the position of the mask member, joint detecting means for detecting a joint position of the endless belt and outputting a second signal indicative of the position of the joint portion, and control mean for controlling the driving means to prevent the mask member from being superposed on the joint portion in accordance with the second signal and to register the mask member in accordance with the first signal.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 22 is an enlarged view of a positioning sensor for registering a mask member having a positioning mark on its rear end;

FIG. 23 is a perspective view showing the manner in which a mask member is registered by the positioning sensor shown in FIG. 22;

FIG. 24 is a block diagram illustrating a registering process; and

FIG. 25 is a block diagram showing another registering process.

DETAILED DESCRIPTION OF THE PREFERRED EMBODIMENTS

Figure 1:
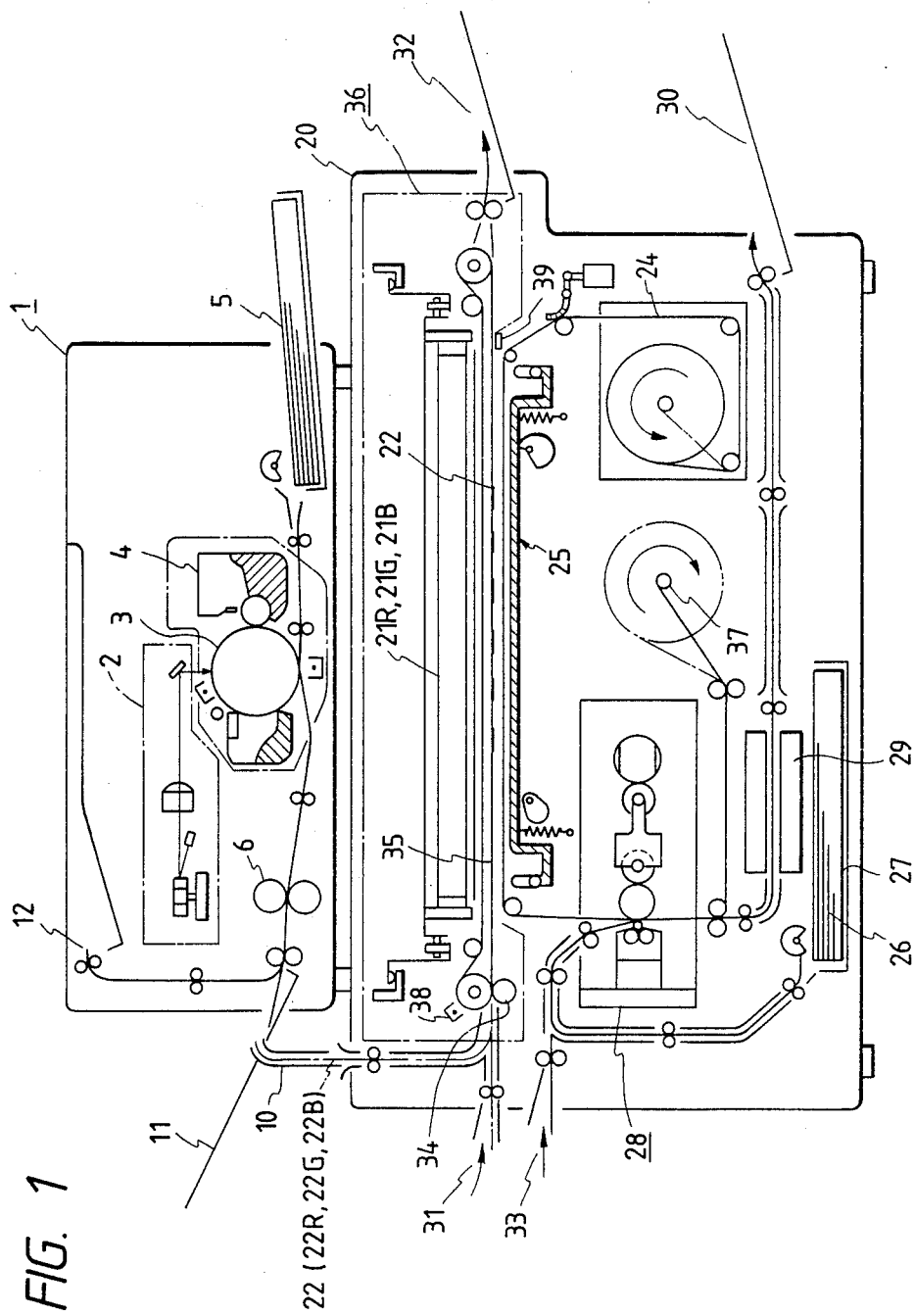
FIG. 1 is a schematic vertical cross-sectional view of a color image recording apparatus according to an embodiment of the present invention, with a monochromatic laser beam printer for producing mask members being mounted on the color image recording apparatus.

Like or corresponding parts are denoted by like or corresponding reference numerals throughout views.

FIG. shows a color image recording apparatus 20 according to an embodiment of the present invention. A monochromatic laser beam printer 1 for producing mask members is mounted on the color image recording apparatus 20 above a color image generator thereof.

Figure 2:
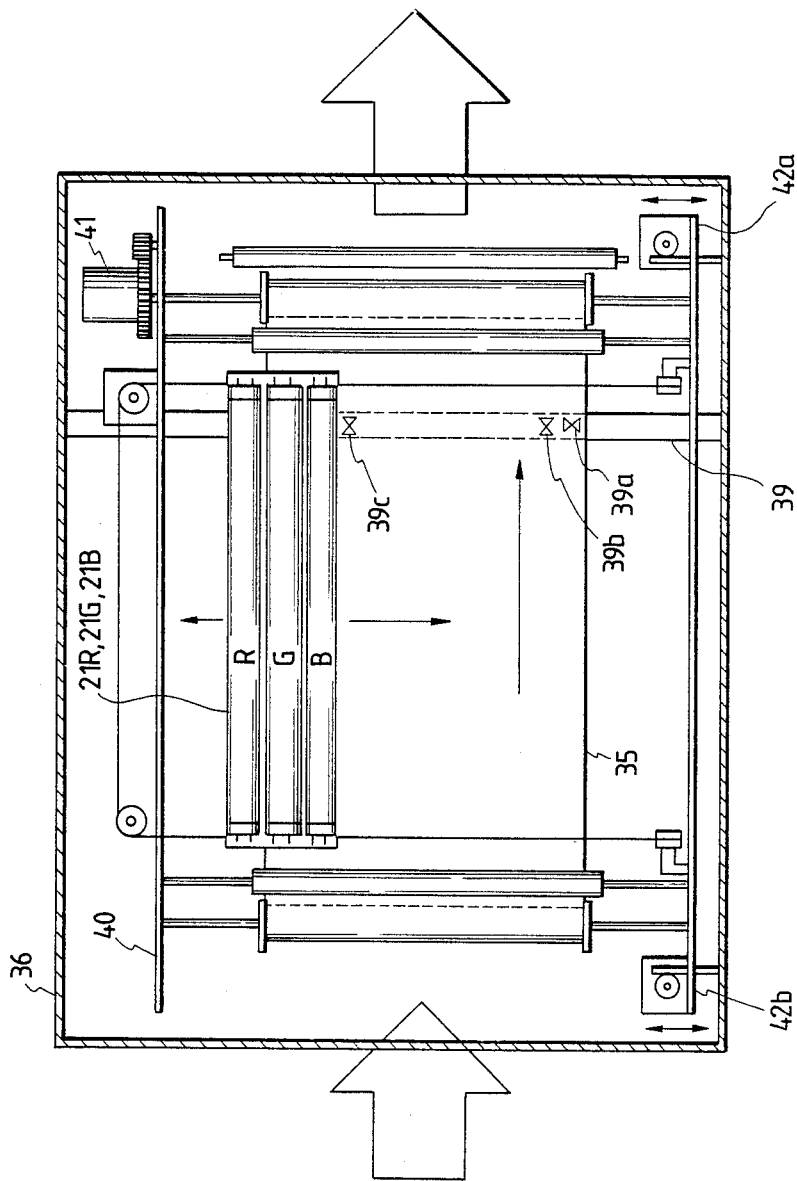
FIG. 2 is a plan view of an exposure unit in &he color image recording apparatus.

The apparatus as shown in FIG. 2 includes a monochromatic laser printer 1 and a color image forming apparatus 20. The laser printer 1 includes an optical unit 2, a photosensitive drum 3, a developing unit 4 and a fixing unit 6. The optical unit 2 includes a polygon scanner 2a to which a laser beam is incident. The laser beam incident to the polygon scanner 2a is oscillated from a laser oscillator 2b in accordance with color image information corresponding to each of red, green and blue of an original image. Such color image information is supplied from a host computer (not shown). The laser beam reflected on one facet of the polygon scanner 2a is applied to the precharged photosensitive drum 3 to thereby form a latent image thereon corresponding to one of red, green and blue colors. The latent image formed on the photosensitive drum 3 is developed in the developing unit 4 to provide a visible toner image. The toner image is transferred onto a plain paper or OHP (overhead projector) film supplied from a sheet cassette 5, and then is fixed in the fixing unit 6. By the laser printer 1, three mask members 22R, 22G and 22B are successively produced corresponding to the three primary colors, i.e., red, green and blue, of the original image, respectively. Specifically, the mask members 22R, 22G and 22B have light shielding images thereon corresponding to patterns of the three primary colors of the original image. Such mask members are used to reproduce the original color image.

When a monochromatic (black-and-white) image is required, an output image sheet from the laser printer 1 is discharged onto a tray 11 or 12. When a color image is desired, an output image sheet serving as a mask member is fed into the color image forming apparatus 20 through a sheet guide 10.

The color image forming apparatus 20 shown in FIG. records a color image with the use of the mask members produced by the laser printer 1. The color image forming apparatus 20 has a mount 10a on which the sheet guide 10 is detachably mounted for supplying the mask members 22 (22R, 22G, 22B) into an exposure unit 36, an exposure table 25 on which the mask member 22 is brought into facial contact with a microcapsule-coated sheet 24, exposure lamps 21R, 21G, 21B of three primary colors, a cassette 27 for storing a stack of developer sheets 26 each coated with a color developer material which reacts with a chromogenic material or a dye precursor encapsulated in microcapsules coated on the sheet 24, a pressure developing unit 28 for pressing the developer sheet 26 and the microcapsule-coated sheet 24 held in superposed relation to rupture the microcapsules which have not been photocured, thereby providing a color image on the developer sheet 26, a thermal fixing unit 29 for promoting color development, a sheet discharge tray 30, a manual insertion tray 31 for allowing the mask member 22 to be manually inserted into the apparatus 20, a mask discharge tray 32 onto which the used mask members 22 are discharged, and e manual insertion tray 33 for allowing the developer sheet 26 to be manually inserted into the apparatus 20.

In a color mode, the mask member 22R corresponding to the red image pattern of the original image is passed through the sheet guide and fed into a nip between rollers 34 by which the position of the mask member 22R is detected by a transparence type of photoelectric conversion sensor 51. The mask member 22R is electrostatically attached to transparent endless conveyor belt 35, for example, made of an insulating material, such as polyethylene terephthalate(PET). The endless conveyor belt 35 is suspended between spaced-apart rollers and electric charges are applied to the surface of the conveyor belt 35 by en electrostatic charge generator, such as a corotron. Then, the mask member 22R is introduced into the exposure area. In the exposure area, the mask member 22R and the microcapsule-coated sheet 24 are held in facial contact with each other on the exposure table 25, and the microcapsule-coated sheet 24 is exposed to light emitted from the exposure lamp 21R through the mask member 22R, thereby producing a latent image corresponding to the light shielding pattern of the mask member 22R on the microcapsule-coated sheet 24. After the exposure is ended, the mask member 22R is discharged onto the tray 32. The same process is also carried out successively with respect to the mask members 22G, 22B corresponding respectively to the green and blue image patterns of the original image to superposedly form green and blue latent images on the microcapsule-coated sheet 24. The exposed microcapsule-coated sheet 24 is then superposed on the developer sheet 26, and the superposed latent images are developed into a visible color image in the pressure developing unit 28. The developer sheet 26 is then passed through the thermal fixing unit 29 and discharged onto the tray 30. The used microcapsule-coated sheet 24 is wound up by a takeup roll 37.

The color image recording apparatus 20 includes an exposure unit 36. As shown in FIGS. 1 and 2, the exposure unit 36 has a sensor holder 39 fixed to a unit frame, a sensor 39a mounted on the sensor holder 39 and comprising a reflective photoelectric sensor for reading a positioning mark portion on an intermediate sheet (mask member) 22, which positioning mark portion extends in a direction perpendicular to the direction in which the intermediate sheet 22 is fed, and a pair of sensors 39b, 39c mounted on the sensor holder 39 and comprising reflective photoelectric sensors for reading a positioning mark portion on the intermediate sheet 2, which positioning mark portion extends in the direction in which the intermediate sheet 22 is fed. The exposure unit 36 also includes a belt roller support unit 40 which supports rollers with the endless feed belt 35 trained therearound, a belt feed motor 41 comprising a stepping motor for circularly moving the feed belt 35 in the sheet feeding direction, a belt moving motor 42a comprising a stepping motor for moving the front end of the belt roller support unit 40 in a direction normal to the sheet feeding direction, i.e., transverse to the feed belt 35, and a belt moving motor 42b comprising a stepping motor for moving the rear end of the belt roller support unit 40 in the direction transverse to the feed belt 35.

The belt moving motors 42a, 42b serve as drive sources for respective mechanisms, each comprising a rack and pinion, for moving the front and rear ends, respectively, of the belt roller support unit 40.

Figure 3:
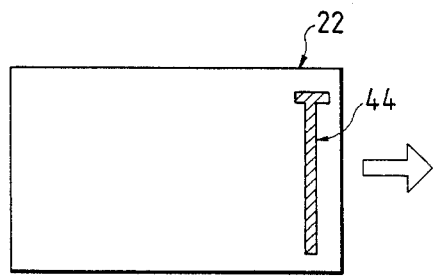
FIG. 3 is a plan view of a mask member with a positioning mark.

As shown in FIG. 3, the intermediate sheet 22 bears a substantially T-shaped positioning mark 44 on its lower surface near the leading end thereof. The positioning mark 44 will be read or detected by the sensors 39a, 39b, 39c. While the positioning mark 44 is shown as being of a T shape, its shape is not limited to the illustrated configuration. The positioning mark 44 is recorded on the intermediate sheet 22 at the same time that an electrostatic latent image is formed on the intermediate sheet 22 in the monochromatic laser beam printer 1. Therefore, the positioning mark 44 is in fixed positional relationship to the electrostatic latent image on the intermediate sheet 22.

Figure 4:
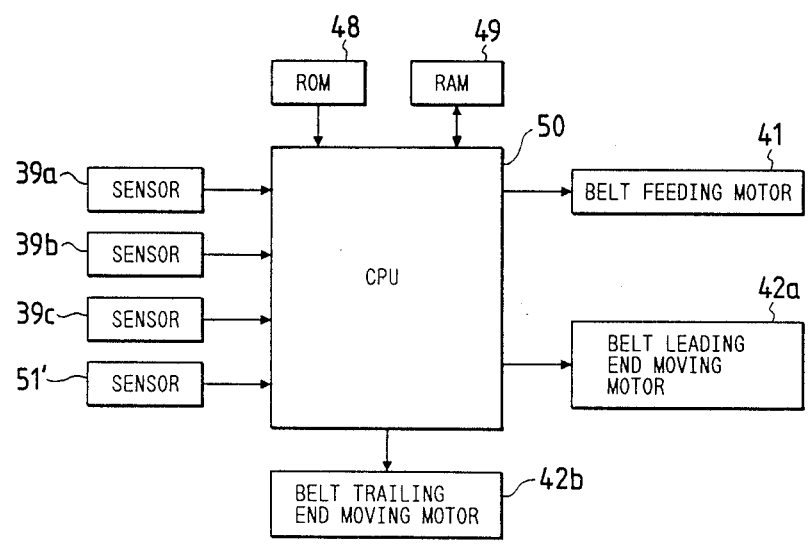
FIG. 4 is a block diagram of a belt drive controller used for registering a mask member.

FIG. 4 shows in block form a belt drive controller for controlling the motors 41, 42a, 42b to register the intermediate sheet 22 in the exposure unit 36 of the color image recording apparatus 20.

The belt drive controller comprises a microcomputer having a ROM 48, e RAM 49, and a CPU 50. The microcomputer executes a control program (described later on) based on output signals form the sensors 39a, 39b, 39c for energizing the belt feed motor 41 and the belt moving motors 42a, 42b to feed and register the intermediate sheet 22.

Figure 5:
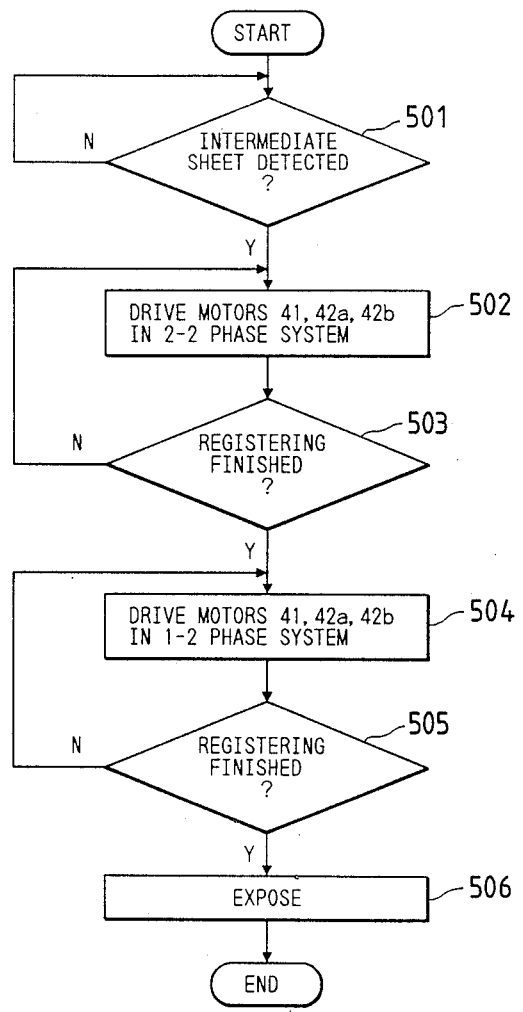
FIG. 5 is a flowchart of a feeding and registering process to be executed by the belt drive controller shown in FIG. 4.

FIG. 5 shows a control sequence or program for carrying out a feeding and registering process for the intermediate sheet 22, among various other control programs to be executed by the microcomputer. The feeding and registering process will now be described with reference to FIG. 5 as well as FIGS. 1 through 4.

An intermediate sheet 22R produced by the monochromatic laser beam printer 1 passes through the intermediate sheet path selector 10 and, then, its leading edge is positioned by an intermediate sheet positioning roller 34. At the same time, a sensor 51 detects the arrival of the intermediate sheet 22R in a step 501.

The intermediate sheet 22R is thereafter attracted to the feed belt 35 by an electrostatic generating element 38 such as a corotron. The feed belt 35 is made of a transparent electrically insulating material such as PET film, for example. By energizing the motors 41, 42a, 42b, the intermediate sheet 22R is fed into the gap between light sources 21R, 21G, 21B in the exposure unit 36 and a photosensitive pressure-sensitive sheet 24 of paper lying therebelow.

At this time, each of the motors 41, 42a, 42b is energized by a 2-2 phase-system with the stroke of an incremental step being of 40 μm, in a step 502.

As a result, the intermediate sheet 22R is fed at a relatively high speed into the gap between the light sources 21R, 21G, 21B and the photosensitive pressure-sensitive sheet 24.

After the intermediate sheet 22R has been substantially completely fed into the gap, and the levels of output signal from the sensors 39a, 39b, 39c have exceeded a certain threshold level in a step 503, the feeding process and an initial registering step are finished, and then a final registering step is started.

At this time, each of the motors 41, 42a, 42b is energized by a 1-2 phase system, with the stroke of an incremental step being reduced to 20 μm, starting the final registering step in a step 504.

Any positional displacements of the intermediate sheet 22R in the feeding direction and the direction normal thereto. and any inclination of the intermediate sheet with respect to the feeding direction are now eliminated in small incremental strokes for thereby registering the intermediate sheet 22R with high accuracy.

After the intermediate sheet 22R has fully been registered, and the levels of output signals from the sensors 39a, 39b, 39c have exceeded another threshold level in a step 505, the final registering step is brought to an end.

After the intermediate sheet 22R has been registered, the intermediate sheet 22R and the photosensitive pressure-sensitive sheet 24 are held intimately against each other by an exposure table 25. Then, the intermediate sheet 22R is exposed to light from the light source 21R, forming a latent image corresponding to the image on the intermediate sheet 22R, on the photosensitive pressure-sensitive sheet 24, in a step 506.

Thereafter, the intermediate sheet 22R is discharged onto the intermediate sheet discharge tray 23. The other intermediate sheets 22G, 22B are also fed, registered, and exposed in the same manner as described above, so that three primary images are formed in superposed relation on the photosensitive pressure-sensitive sheet 24 by exposure through the intermediate sheets 22R, 22G, 22B.

After the superposed exposure, the photosensitive pressure-sensitive sheet 24 is held against a color developer sheet 26, and then the three primary images are developed into a visible colored image on the color developer sheet 26 in the pressure-developing unit 28. The color developer sheet 26 is then discharged onto a discharge tray 30.

After the image has been developed under pressure on the color developer sheet 26, the used photosensitive pressure-sensitive sheet 24 is wound on a takeup reel 37.

With the above embodiment, to feed and initially register the intermediate sheet 22, the intervals of incremental steps of the stepping motors 41, 42a, 42b are selected to be larger (40 μm) by switching the excited phases in the step 502. To finally register the intermediate sheet 22, the intervals of incremental steps of the stepping motors 41, 42a, 42b are selected to be smaller (20 μm) by switching the excited phases in the step 504. Therefore, the intermediate sheet 22 can be fed at a high speed into the gap between the light sources and the photosensitive pressure-sensitive sheet 24, and can be registered quickly and accurately in the gap.

For more accurately registering the intermediate sheet 22, the stepping motors 41, 42a, 42b may be energized between phases and de-energized in phase divisions (e.g., 8 phase divisions).

In this embodiment, as described above, to feed and initially register the intermediate sheet, the intervals of incremental steps of the stepping motors are selected to be larger by the excited phase switching, and to finally register the intermediate sheet, the intervals of incremental steps of the stepping motors are selected to be smaller by the excited phase switching in the step. Therefore, the intermediate sheet can be fed at a high speed into the gap between the light sources and the photosensitive pressure-sensitive sheet, and can be registered quickly and accurately in the gap, so that three primary images can quickly and accurately be formed in superposed relation on the photosensitive recording medium by exposure to light from the light sources. The problems of the conventional color image recording apparatus which are caused by the same interval of incremental steps of the stepping motors in the processes of feeding and registering the intermediate sheets are solved by the arrangement of the present embodiment. In the above embodiment, the intermediate sheet is fed and registered by selectively changing the intervals of incremental steps of the stepping motors between the two values by the excited phase switching. However, the intermediate sheet may be moved at a high speed (rough positioning) and then registered in fine adjustments by selectively changing the magnitude of electric energy to be applied to a single motor between at least three values with a motor drive circuit.

Figure 6:
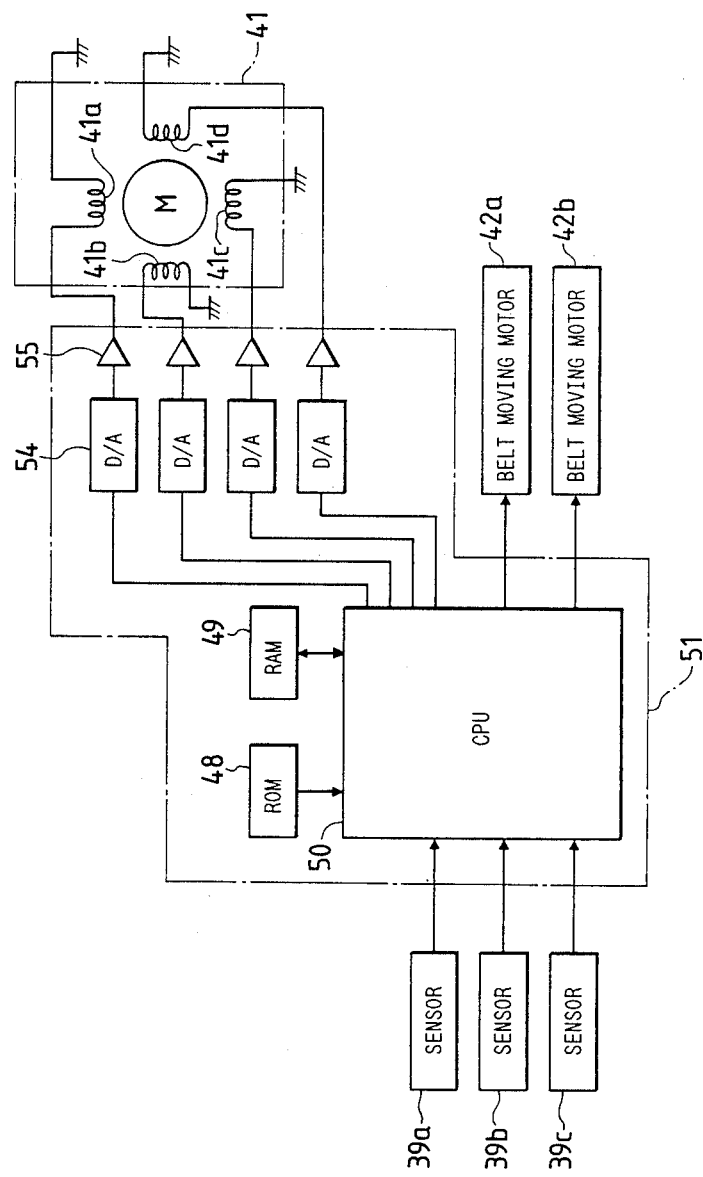
FIG. 6 is a block diagram of a belt drive controller with a motor drive circuit.

FIG. 6 shows in block form a belt drive controller with a motor drive circuit, which may be employed to drive the motors 41, 42a, 41b in the color image recording apparatus shown in FIG. A motor drive circuit 51 serves as a circuit for controlling the belt feed motor 41, and comprises a microcomputer. The motor drive circuit 51 can selectively apply electric power in three or more magnitudes to energize each phase of the belt feed motor 41 which comprises a stepping motor. For example, the motor drive circuit 51 can first select a maximum-power energized mode or a non-energized mode, and then select one at a time of the maximum-power energized mode, at least one intermediate-power energized mode, and the de-energized mode for energizing each phase of the belt feed motor 41. The motor drive circuit 51 is supplied with output signals from sensors 39a, 39b, 39c which are the same as those shown in FIGS. 2 end 4 The motor drive circuit 51 also has a CPU 50, a ROM 52, and a RAM 53 which are identical to those shown in FIG. 4. D/A converters 50 are connected to the CPU 50 and also to phase energizing coils 41a, 41b, 41c, 41d of the belt feed motor 41 through respective amplifiers 55. The microcomputer also serves to control the motors 42a, 42b.

Operation of the color image recording apparatus which employs the motor drive circuit 51 shown in FIG. 6 will be described below also with reference to FIG. 1. For recording a colored image, an intermediate sheet 22R produced by the monochromatic laser beam printer 1 passes through the intermediate sheet path selector 10 and, then, its leading edge is positioned by the intermediate sheet positioning roller 34.

The intermediate sheet 22R is thereafter attracted to the feed belt 35 by the electrostatic generating element 3B. By energizing the belt feed motor 41, the intermediate sheet 22R attracted to the belt 35 is fed into the exposure unit 36. At this time, the intermediate sheet 22R is fed at a high speed. More specifically, the belt feed motor 41 is energized by the motor drive circuit 5i in a 2-2 phase system which is generally used with 4-phase stepping motors. Each of the phases of the belt feed motor 41 is repeatedly energized in the maximum-power energized mode and the deenergized mode for feeding the belt 35 at a high speed. In the maximum-power energized mode, the maximum magnitude of electric power or a magnitude close to the maximum magnitude is applied to the belt feet motor 41.

When the positioning mark 44 on the intermediate sheet 22R as it is fed is detected by any one of the sensors 39b, 39c, the sensor generates a signal which is supplied to the motor drive circuit 50. Thereafter, output signals from the sensors 39a, 39b, 39c are applied to the motor drive circuit 50 and processed thereby to control the motors 41, 42b, thus moving the belt 35 and the belt roller support frame 40. The position of the intermediate sheet 22R in the direction in which it is fed is corrected by the belt feed motor 41, whereas the position of the intermediate sheet 22R in the direction normal to the sheet feeding direction is corrected by the belt moving motors 42a, 42b that move the intermediate sheet 22R for the same interval in the same direction. The belt moving motors 42a, 42b are then energized to move the intermediate sheet 22R through different intervals for correcting the intermediate sheet 22R out of any skewed condition.

The intermediate sheet 22R is thus positionally controlled until its position can no longer be corrected with one-step incremental stroke of the belt feed motor 41 energized in the 2-2 phase system. Subsequently, the motor drive circuit 51 does not energize a phase of the motor 41 directly with 100% of available electric power from the deenergized mode, but energizes the phase of the motor 41 first with 50 of available electric power from the deenergized mode, and then with 100 of available electric power. If two intermediate-magnitude energized modes are employed, the motor drive circuit 51 energizes the motor 41 from the de-energized mode (0%) successively with 33%, 66% and then 100% of available electric power. At the same time, the motor drive circuit 51 de-energizes a phase of the motor 41 from the maximum-power energized mode (100%) successively with 50% of available electric power and then 0% thereof (de-energized mode). By applying successively varying magnitudes of electric power to the motor 41' the motor 41 can feed the intermediate sheet at a lower speed for smaller intervals.

The leading edge of the intermediate sheet 22R is thus accurately positioned by the positioning mark 44. After the intermediate sheet 22R has fully been registered, the same color image producing process as described above with reference to FIGS. 1 through 5 is carried out to produce a colored image on a color developer sheet 26 and to discharge the color developer sheet 26 onto the sheet discharge tray 30.

In the prior apparatus disclosed in U.S. patent application Ser. No. 07/255,342, while the intermediate sheet is being fed, its skew and positional displacements in the sheet feeding direction and also in the direction normal to the sheet feeding direction are detected from the interval by which the belt is fed and also from the timing at which the sensors detect the positioning reference marks on the intermediate sheet. Intervals by which the belt and two belt support moving means are to be moved for eliminating sheet skews and positional displacement are stored as a lookup table in a memory. Control values which are determined from the lookup table are then used to actuate the belt drive means and the two belt support moving means for feeding and registering the intermediate sheet under open-loop control.

If the intermediate sheet is not fed for a desired interval due to a torque shortage of a motor for feeding the belt or moving the belt support, or if the drive system suffers a mechanical error such as a gear backlash or a joint play or lost motion, then the intermediate sheet cannot be registered highly accurately.

The above problem can be solved by a closed-loop control process which monitors output signals from the positioning sensors while allowing the belt drive means to feed the belt and also allowing the tow belt support moving means to move the belt support, and de-energizes the belt drive means and the belt support moving means when the output signals from the positioning sensors reach values indicative of the completion of the registering process. More specifically, even when the intermediate sheet is not fed for a desired interval due to a torque shortage of the motor for feeding the belt or moving the belt support, or when the drive system suffers a mechanical error such as a gear backlash or a joint play or los motion, since the actual interval of feeding movement is used for feedback control, such errors can be removed, and the three intermediate sheets can successively registered highly accurately. As a result, the photosensitive pressure-sensitive medium can be exposed to three primary images which are successively brought in by the intermediate sheets.

Figure 7:
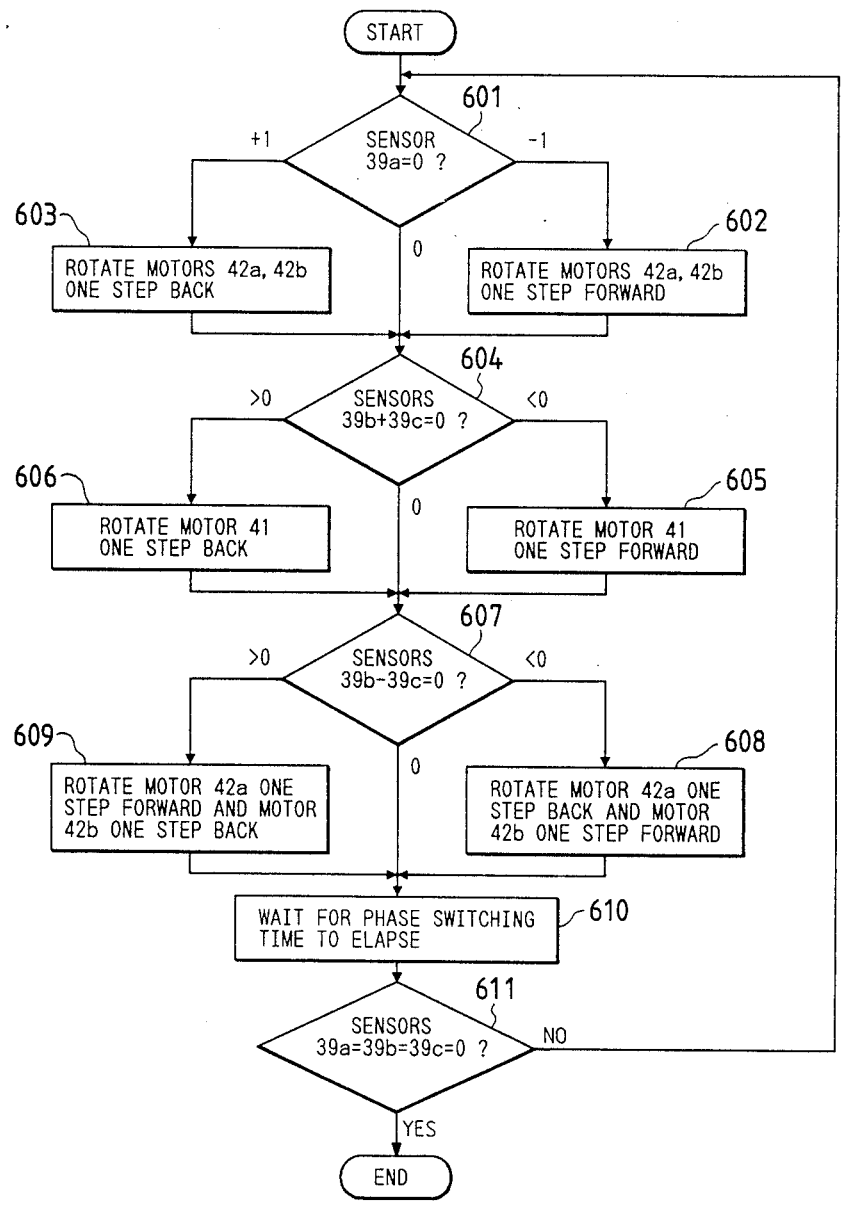
FIG. 7 is a flowchart of a process for closed-loop control.

The above solution can be achieved by a color image recording apparatus which is of basically the same construction as that shown in FIGS. 1 and 2. The belt drive controller in the color image recording apparatus is also essentially identical to that shown in FIG. 4, except for a control program to be executed by the CPU 50. FIG. 7 shows a closed-loop control sequence to be executed by the CPU 50, for carrying out a registering process for the intermediate sheet 22, among various other control programs to be executed by the microcomputer. The closed-loop registering process will now be described with reference to FIG. 7 as well as FIG. 1.

An intermediate sheet 22R produced by the monochromatic laser beam printer 1 passes through the intermediate sheet path selector 10 and, then, its leading edge is positioned by an intermediate sheet positioning roller 34.

The intermediate sheet 22R is thereafter attracted to the feed belt 35 by the electrostatic generating element 38. While the belt moving motors 42a, 42b are being locked, the belt teed motor 41 is energized to feed the intermediate sheet 22R into the gap between the light sources 21R, 21G, 21B in the exposure unit 36 and the photosensitive pressure-sensitive sheet 24.

Then, the registering process of FIG. 7 is executed.

In this embodiment, each of the sensors 39a, 39b, 39c produces a signal "+1" when the intermediate sheet 22R is positioned beyond a predetermined position, a signal "0" when the intermediate sheet 33R is in the predetermined position, and a signal "−1" when the intermediate sheet 22R is short of the predetermined position.

When the registering process is started in FIG. 7, the intermediate sheet 22R is first corrected to remove a positional displacement in the direction normal to the sheet feeding direction, i.e., transverse to the feed belt 35.

The output signal from the sensor 39a, which detects a positional displacement of the intermediate sheet 22R in the transverse direction, is read in, and a step 601 determines whether the read output signal is "+1", "0", or "−1".

If the intermediate sheet 22R is transversely displaced to the left or right out of the predetermined position, then the output signal from the sensor 39a is "+1" or "−138 . If the sensor signal is "+1", then the motors 42a, 42b for moving the front and rear ends of the belt 35 are energized to rotate one step back in a step 603. If the sensor signal is "−1", then the motors 42a, 42b are energized to rotate one step forward in a step 602. If the sensor signal is "0", then the motors 42a, 42b are not energized and hence no positional correction is effected in the transverse direction.

Upon completion of the transverse positional correction, the intermediate sheet 22R is then positionally corrected in the sheet feeding direction.

More specifically, the output signals from the sensors 39b, 39c, which detect positional displacements of the righthand and lefthand leading ends of the intermediate sheet 22R in tho sheet feeding direction, are read in, and a step 604 determines if the sum (39b+39c) of the sensor output signals is positive, zero, or negative.

If the intermediate sheet 22R is displaced as a whole from the predetermined position forwardly or rearwardly in the sheet feeding direction, then the sum of the output signals from the sensors 39b, 39c becomes positive or negative. If the sum of the sensor output signals is positive, then the motor 41 is energized to rotate one step back in a step 606. If the sum of the sensor output signals is negative, then the motor 41 is energized to rotate one step forward in a step 605. If the sum of the sensor output signals is zero, i.e., if the intermediate sheet 22R is not positionally displaced in the sheet feeding direction, then no positional correction is effected in the sheet feeding direction.

After the intermediate sheet 22R has been positionally corrected in the sheet feeding direction, the intermediate sheet 22R is corrected out of a skewed condition.

More specifically, the output signals from the sensors 39b, 39c, which detect positional displacements of the righthand and lefthand leading ends of the intermediate sheet 22R in the sheet feeding direction, are read in, and a step 607 determines if the difference (39b−39c) between the sensor output signals is positive, zero, or negative.

If the intermediate sheet 22R is skewed to the left or right with respect to the sheet feeding direction, then the difference between the output signals from the sensors 39b, 39c becomes positive or negative. If the difference between the sensor output signals is positive, then the motor 42a for moving the front end of the belt 35 is energized to rotate one step forward and the motor 42b for moving the rear end of the belt 35 is energized to rotate one step back in a step 609. If the difference between the sensor output signals is negative, then the motor 42a is energized to rotate one step back and the motor 42b is energized to rotate one step forward in a step 608. If the difference between the sensor output signals is zero, i.e., if the intermediate sheet 22R is not skewed with respect to the sheet feeding direction, then no skew correction is effected with respect to the sheet feeding direction.

After the intermediate sheet 22R has been corrected out of the skewed position with respect to the sheet feeding direction, then a time required to switch between the phases of the motors is allowed to elapse in a step 610. Thereafter, a step 611 determines whether the intermediate sheet 22R has been registered in a desired position When the intermediate sheet 22R is registered properly in the desired position, the output signals from the sensors 39a, 39b, 39c are all zero, thus finishing the registering process. If the intermediate sheet 22R still remains displaced or skewed, then the above steps 601 through 610 are repeated.

A colored image producing process after the registering process is the same as the process described above with reference to FIG. 1, and will not be described below.

In the embodiment shown in FIG. 7, for registering the intermediate sheet 22, the output signals from the photoelectric sensors 39a, 39b, 39c are monitored in the steps 601, 604 607, 611, and when the output signals reach the values indicative of &he completion of the registering process (39a=0, 39c=0), the motors 41, 42a, 42b are deenergized. Since the control process shown in FIG. 7 is a closed-loop control process, a failure to feed the intermediate sheet due to a torque shortage of the motors or a mechanical error in the drive system can be removed based on an actual interval by which the intermediate sheet is fed or moved transversely and which is fed back for feedback control Consequently, the three intermediate sheets can accurately be registered, so that three primary images on the intermediate sheets can be formed on the photosensitive pressure-sensitive recording medium highly accurately in superposed relationship.

Figure 8:
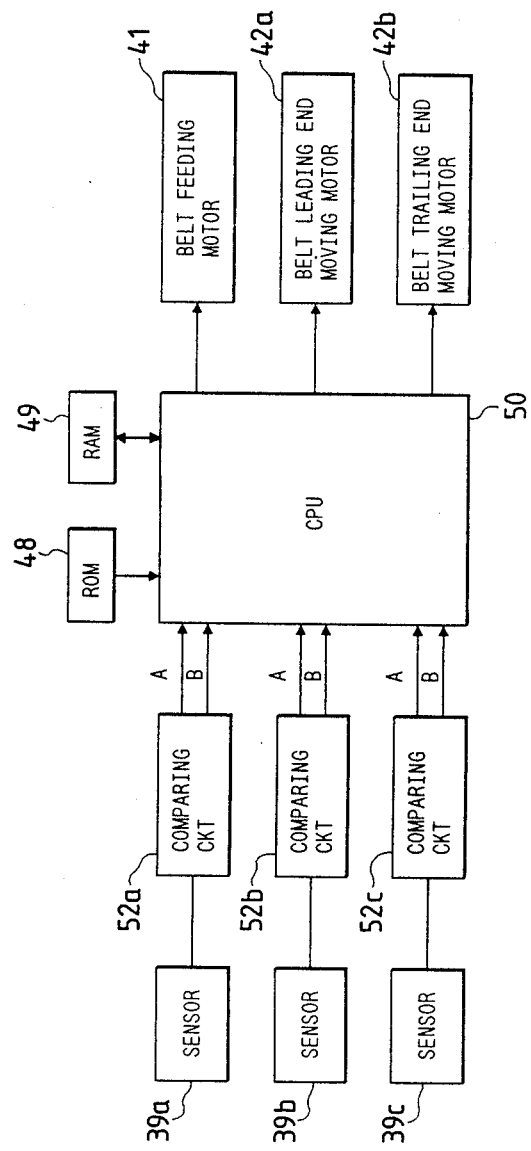
FIG. 8 is a block diagram of a belt drive controller with comparing circuits for comparing sensor output signals with two threshold values.

FIG. 8 shows in block form another belt drive controller for controlling the sheet registering mechanism in the color image recording apparatus according to the present invention.

The belt drive controller of FIG. 8 differs from the belt drive controller shown in FIG. 4 in that the output signals from the sensors 39a, 39b, 39c are sent through comparing circuits 51a, 51b, 51c, respectively, to the CPU 50. The output signals from the sensors 39a, 39b, 39c are therefore determined by the respective comparing circuits 51a, 51b, 51c for energizing the motors 41, 42a, 42b to feed and register the intermediate sheet 22.

Each of the comparing circuits 52a, 52b, 52c will be described in detail with reference to FIG. 9.

The comparing circuit comprises two comparators CPA, CPB for comparing the output signal from the sensor with two higher and lower threshold voltages VH, VL. The comparators CPA, CPB issue logic outputs A, B, respectively.

Figure 10:
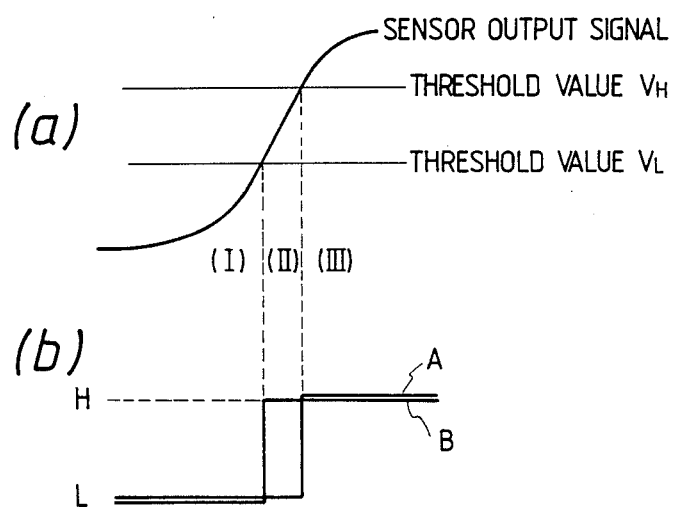
FIG. 10 is a diagram showing input and output signals of the comparing circuit.

AS Shown in FIG. 10, the CPU 50 determines that the intermediate sheet 22 is positioned short of a predetermined or target position (condition I) when the logic outputs are A=B="L", the intermediate sheet 22 is positioned in the target position (condition II) when the logic outputs are A="L" and B="H", and the intermediate sheet 22 is positioned in excess of the target position (condition III) when the logic outputs are A=B="H".

An intermediate sheet 22R produced by the monochromatic laser beam printer 1 passes through the intermediate sheet path selector 10 and, then, its leading edge is positioned by an intermediate sheet positioning roller 34.

The intermediate sheet 22R is thereafter attracted to the feed belt 35 by the electrostatic generating element 38. The belt feed motor 41 is energized to feed the intermediate sheet 22R into the gap between the light sources 21R, 21G, 21B in the exposure unit 36 and the photosensitive pressure-sensitive sheet 24.

Then the registering process is executed.

When the registering process is started, the output signal from the sensor 39a, which detects a positional displacement of the intermediate sheet 22R in the transverse direction, is read in through the comparing circuit 51a, and it is determined whether the intermediate sheet 22R is in the condition (I), (II), or (III).

If the intermediate sheet 22R is in the condition (I), then the motors 42a, 42b are energized to rotate one step back. If the intermediate sheet 22R is in the condition (III), then the motors 42a, 42b are energized to rotate one step forward. At any rate, the intermediate sheet 22R is translated one step in the transverse direction. If the intermediate sheet 22R is in the condition (II), i.e., if it is not positionally displaced in the transverse direction, then no positional correction is effected in the transverse direction.

After the positional displacement of the intermediate sheet 22R is corrected one step in the transverse direction, the positional displacement of the intermediate sheet 22R in the sheet feeding direction is then corrected.

More specifically, the output signals from the sensors 39b, 39c, which detect positional displacements of the righthand and lefthand leading ends of the intermediate sheet 22R in the sheet feeding direction, are read in through the comparing circuits 52b, 52c, and it is determined whether both the righthand and lefthand leading ends of the intermediate sheet 22R are in the condition (I) or the condition (III).

If the intermediate sheet 22R is displaced as a whole from the predetermined position forwardly or rearwardly in the sheet feeding direction then both the output signals from the comparing circuits 51b, 51c indicate the condition (I) or the condition (III).

If both the output signals from the comparing circuits 51b, 51c indicate the condition (I), then the belt feed motor 41 is energized to rotate one step back. If both the output signals from the comparing circuits 51b, 51c indicate the condition (III), then the belt feed motor 41 is energized to rotate one step forward. Thus, the intermediate sheet 22R is translated one step in the sheet feeding direction. If the intermediate sheet 22R is in the condition (II), i.e., if it is not positionally displaced in the sheet feeding direction, then no positional correction is effected in the sheet feeding direction.

After the positional displacement of the intermediate sheet 22R is corrected one step in the sheet feeding direction, the intermediate sheet 22R is corrected out of a skewed condition.

More specifically, the output signal from the sensors 39b, 39c, are read in through the comparing circuits 52b, 52c, and it is determined whether either one of the output signals from the comparing circuits 52b, 52c indicates the condition (I) and the other indicates the condition (III).

If the intermediate sheet 22R is skewed to the right or left with respect to the sheet feeding direction, then one of the output signals form the comparing circuits 52b, 52c indicates the condition (I) and the other indicates the condition (III).

If the output signal from the comparing circuit 52b indicates the condition (I) and the output signal from the comparing circuit 52c indicates the condition (III), then the motor 42a is energized to rotate one step forward and the motor 42b is energized to rotate one step back. If the output signal from the comparing circuit 52b indicates the condition (III) and the output signal from the comparing circuit 52c indicates the condition (I), then the motor 42a is energized to rotate one step back and the motor 42b is energized to rotate one step forward. The intermediate sheet 22R is thus turned one step clockwise or counterclockwise as viewed in plan. If the intermediate sheet 22R is not skewed with respect to the sheet feeding direction. then no skew correction is effected with respect to the sheet feeding direction.

After the intermediate sheet 22R has been corrected out of the skewed position with respect to the sheet feeding direction, then a time required to switch between the phases of the motors is allowed to elapse, and thereafter, it is determined whether the intermediate sheet 22R has been registered in a desired position.

When the intermediate sheet 22R is registered properly in the desired position, the output signals from the comparing circuits 52a, 52b, 52c indicate the condition (II), thus finishing the registering process. If the intermediate sheet 22R still remains displaced or skewed, then it is positionally corrected in the sheet feeding direction, or in the direction normal to the sheet feeding direction, or out of the skewed condition.

With the prior apparatus, the condition (II) cannot directly be determined from output signals of the positioning sensors, and hence when the intermediate sheet has been corrected out of a skewed condition, it must be fed again to confirm any positional displacements in the sheet feeding direction and the direction normal thereto and any skewed condition. According to the above arrangement of the present invention, however, since any positional displacements can immediately be confirmed from the output signals of the comparing circuits 52a, 52b, a quick registering process can be effected without wasting time.

A colored image producing process after the registering process is the same as the process described above with reference to FIG. 1, and will not be described below.

Figure 9:
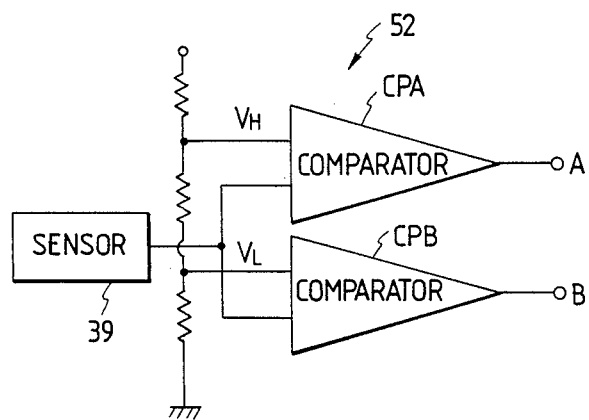
FIG. 9 is a block diagram of each of the comparing circuits.

In the embodiment shown in FIGS. 8 through 10, the output signals from the sensors 39a, 39b, 39c are compared with the two threshold values VH, VL in the comparing circuits 52a, 52b, 52c to determine whether the intermediate sheet is positioned in the predetermined target position (condition II) or not (condition I or III). If the intermediate sheet is out of the target position, then the feed belt and the belt support are moved in order to correct the displacement of the intermediate sheet under feedback control so that the intermediate sheet can be registered. Therefore, when the intermediate sheet is positionally displaced again with respect to a sensor for which it has once been registered, such a positional displacement can be determined directly from the output signals of the comparing circuits 52a, 52b, 52c without having to feed the intermediate sheet again. As a result, the intermediate sheet can fully be registered in a short period of time under simple control.

While two threshold values are employed in the above embodiment, more threshold values may be used to determine the degree to which the intermediate sheet has been displaced from the target position. The output signals from the sensors may be compared with the threshold values through a software-implemented arrangement rather than the hardware implemented comparing circuits.

With the prior apparatus and the foregoing embodiments, an intermediate sheet is registered by correcting its position in the sheet feeding direction, correcting the intermediate sheet out of its skewed condition, and correcting its position in the direction normal to the sheet feeding direction. These correcting steps are successively effected at different times.

Figure 11:
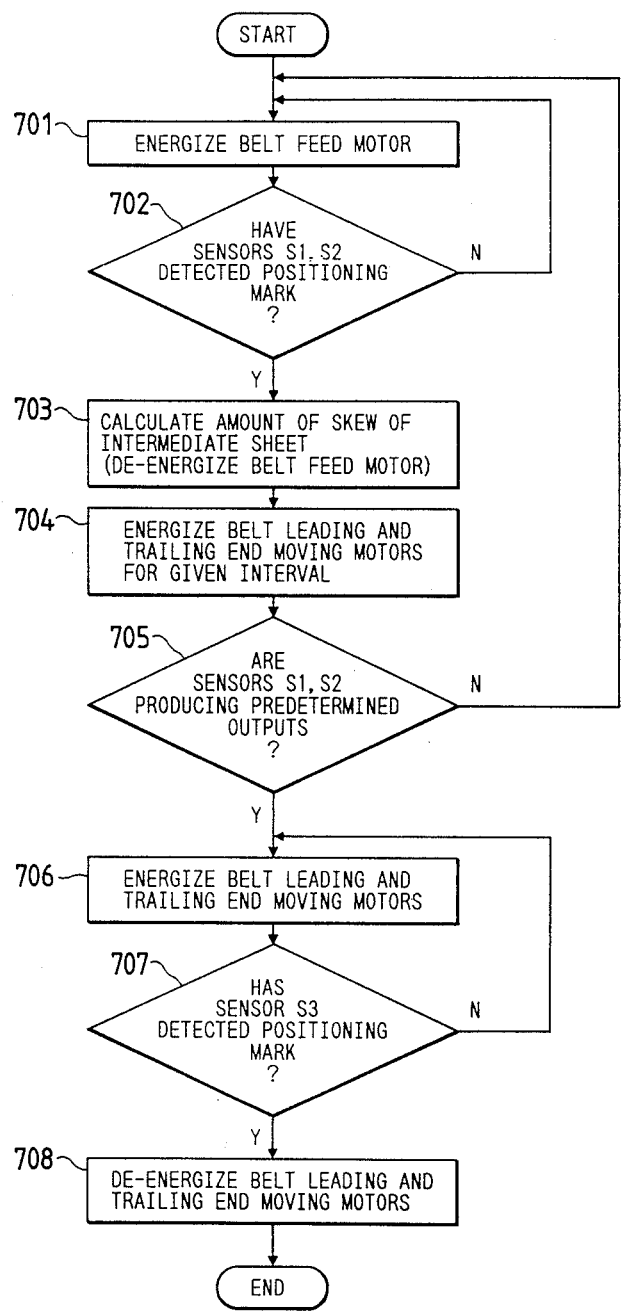
FIG. 11 is a flowchart of a control algorithm for successively effecting registering steps.

More specifically, as shown in FIG. 11, the belt feed motor is energized to feed an intermediate sheet in a step 701. When both sensors S1, S2 (corresponding to the sensors 39b, 39c) detect the transverse section of the positioning reference mark on the intermediate sheet in a step 702, the belt feed motor is de-energized, thus finishing the step of correcting the position of the intermediate sheet in the sheet feeding direction, and the amount of skew of the intermediate sheet is determined from the number of steps for step motors which corresponds to the interval between time at which the reference mark is detected by the sensors S1, S2 in a step 703. Depending on the detected amount of skew, the belt moving motors for moving the front and rear ends of the belt are energized to correct the intermediate sheet out of any skewed condition in a step 704. Then, if the intermediate sheet is positionally displaced again in the sheet feeding direction when its skew is corrected in a step 705, then the steps 701 through 704 are repeated until the sensors S1, s" produce prescribed output signals, i.e., the intermediate sheet is positionally corrected in the sheet feeding direction and out of the skewed condition, in the step 705. Thereafter, the belt moving motors are energized to correct the position of the intermediate sheet in the transverse direction thereof, i.e., in the direction normal to the sheet feeding direction, in a step 706. If a sensor S3 (corresponding to the sensor 39a) detects the longitudinal section of the positioning reference mark in a step 707, then the belt moving motors are de-energized in a step 708, thus finishing the step of correcting the position of the intermediate sheet in the transverse direction. Thereafter, the registering process for the intermediate sheet is brought to an end.

Since the intermediate sheet is registered by the separate steps of correcting its position in the sheet feeding direction, correcting the intermediate sheet out of its skewed condition, and correcting its position in the direction normal to the sheet feeding direction, and these correcting steps are successively effected at different time, as described above, it takes time to effect the registering process. In addition, since the sensors S1 through S3 and the motors are not arranged in a 1:1 correspondence, the control program or algorithm tends to be complex.

The aforesaid problem can be solved by providing three positioning sensors for individually detecting positional displacements of an intermediate sheet in the sheet feeding and moving directions, and feeding output signals from the sensors back to the belt drive systems and simultaneously correcting the positional displacements to register the intermediate sheet in a proper position.

The above solution can be achieved by an arrangement including the color image recording apparatus shown in FIG. which has the exposure unit shown in FIG. 2 and the belt drive controller shown in FIG. 4. In such an arrangement, however, the sensor 39a is associated with the motor 42a, the sensor 39b with the motor 41, and the sensor 39c with the motor 42b, and the motors are controlled under feedback control based on output signals from the associated sensors only.

Figure 12:
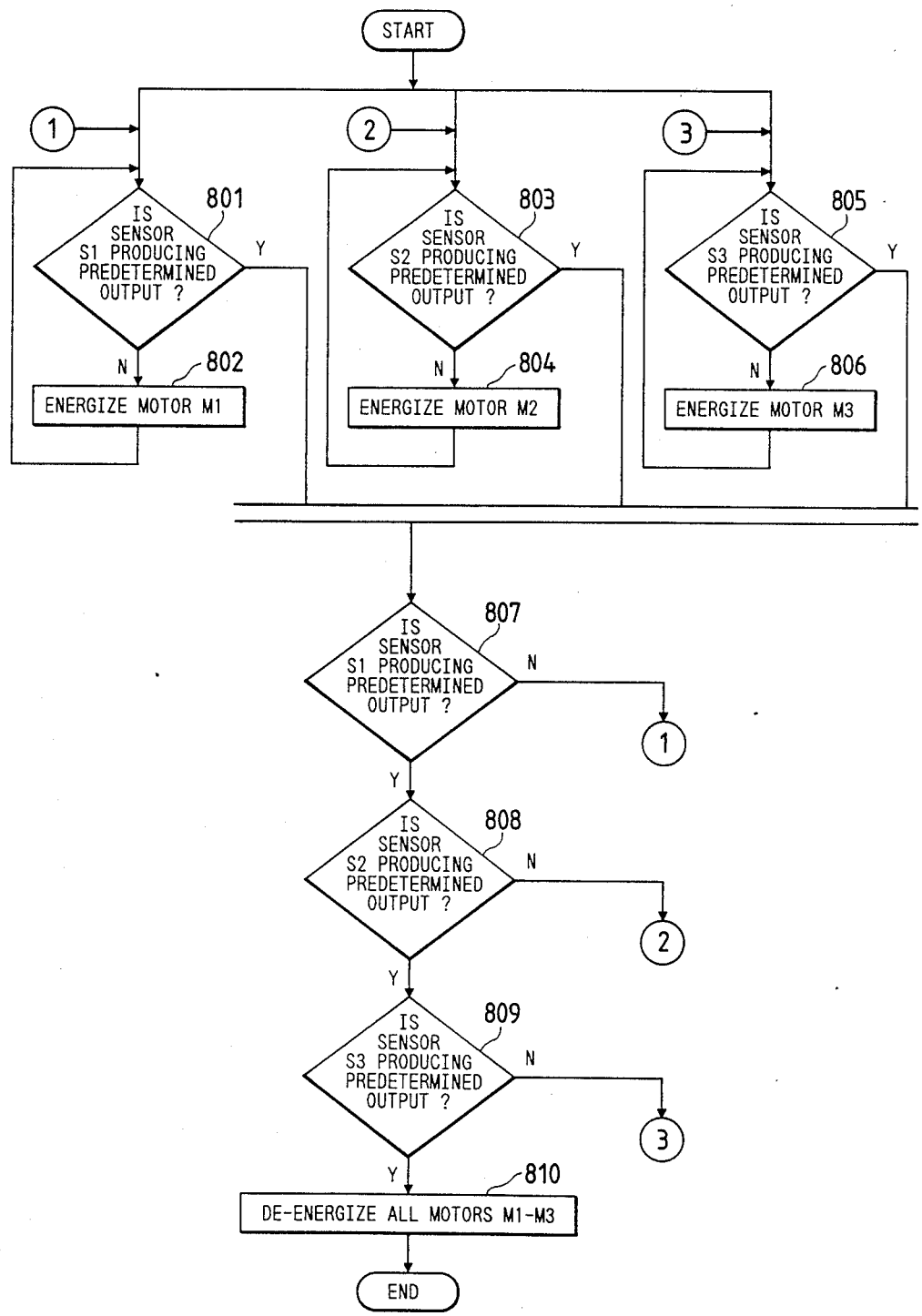
FIG. 12 is a flowchart of a control algorithm for simultaneously effecting registering steps.

FIG. 12 shows a control sequence or program for carrying out a registering process for the intermediate sheet 22, among various other control programs to be executed by the microcomputer. The registering process employing parallel control will now be described with reference to FIG. 12 as well as FIG. 1.

An intermediate sheet 22R produced by the monochromatic laser beam printer 1 passes through the intermediate sheet path selector 10 and, then, its leading edge is positioned by an intermediate sheet positioning roller 34.

The intermediate sheet 22R is thereafter attracted to the feed belt 35 by the electrostatic generating element 38. By energizing the belt feed motor 41, the intermediate sheet 22R is fed into the gap between light sources 21R, 21G, 21B in the exposure unit 36 and the photosensitive pressure-sensitive sheet 24.

Then, the registering process shown in FIG. 12 is initiated.

In the following description of the registering process of FIG. 12, the sensors 39b, 39c, 39a are referred to as sensors S1, s", S3, respectively, and the motors 41, 42a, 42b as motors M1, M2, M3, respectively.

When the registering process is started, output signals from the sensors S1, S2, S3 are independently fed back to the drive systems for the motors M1, M2, M3 for simultaneously eliminating positional displacements of an intermediate sheet in the respective directions by employing the time slice function of the microcomputer.

More specifically, while the output signal from the sensor S1 is being fed back for feedback control, the belt feed motor M1 is continuously energized until the output signal from the sensor S1 reaches a predetermined level indicative of a target position in the sheet feeding direction, in steps 801, 802.

At the same time, while the output signal from the sensor S2 is being fed back for feedback control, the belt moving motor M2 for moving the front end of the belt 35 is continuously energized until the output signal from the sensor S2 reaches a target position in the direction to move the front end of the belt 35, in steps 803, 804.

At the same time, while the output signal from the sensor S3 is being fed back for feedback control the belt moving motor M3 for moving the rear end of the belt 35 is continuously energized until the output signal from the sensor S3 reaches a target position in the direction to move the rear end of the belt 35, in steps 805, 806.

The motors M1 through M3 are therefore controlled in their operation while the output signals from the corresponding sensors S1 through S3 are being only monitored. For controlling each of the motors M1 through M3, it is only necessary to feed back the output signal from the associated sensor, and it is not necessary to monitor the output signals from the other sensors for the control of that motor. Therefore, the control process is that much easier.

Upon completion of the correction of a positional displacement in any of the directions, the correction in that direction is stopped, and the completion of the correction of positional displacements in the other directions is awaited.

If a positional displacement of the intermediate sheet is caused in a direction in which it has once been registered, due to registering processes in the other directions, in a step 807, 808, or 809, then the registering process in that direction is resumed to eliminate the positional displacement.

After the correction of the positional displacements in all the directions has been completed in the steps 807, 808, 809, the motors M1 through M3 are de-energized in a step 810. whereupon the registering process for the intermediate sheet is finished.

After the registering process, the same image colored image process as the process described above with reference to FIG. 1 is carried out With the above embodiment, the three sensors S1, S2, s# are employed which individually detect any positional displacements of the intermediate sheet in the sheet feeding direction and belt moving directions, and to register the intermediate sheet, the output signals from the sensors S1, S2, s# are fed back for the control of the motors M1, M2, M3, respectively to correct the positional displacements simultaneously. Therefore, the registering process for the intermediate sheet is effected more quickly and the control algorithm used is simpler than would be if the steps of correcting the positional displacements in the sheet feeding direction and in the direction normal to the sheet feeding direction, and correcting the intermediate sheet out of a skewed condition were successively carried out at different times.

According to the foregoing embodiments, a positioning mark is put on the leading edge portion of an intermediate sheet, and the feed belt which carries the intermediate sheet is driven and the belt support supporting the feed belt is moved while detecting the positioning mark with sensors, thus registering the intermediate sheet.

With such a registering process, however, it is difficult to ensure accurate registration at a location remote from the positioning mark. Specifically, where a positioning mark is positioned on only the leading end portion of the intermediate sheet and the intermediate sheet is registered with reference to the leading end thereof only, if the intermediate sheet suffers an inaccuracy such as a printing pitch irregularity which has occurred when it is produced, then an appreciable color shift will be brought about at the trailing end of the intermediate sheet remote from the positioning mark.

The above drawback can be eliminated as follows: when an intermediate sheet is to be registered at a predetermined position with respect to the photosensitive pressure-sensitive medium by positioning sensors and an intermediate sheet moving means which comprises a belt feed motor and belt moving motors, positioning marks on opposite ends (e.g., leading and trailing ends) of the intermediate sheet are read by the positioning sensors, and the intermediate sheet is controlled in position by a control means based on the output signals from the positioning sensors. As a result, the intermediate sheet is registered with respect to a middle point between the positioning marks thereon, i.e., in the vicinity of the center of the intermediate sheet. In as much as the intermediate sheet is registered with respect to its central area, even if the intermediate sheet has a certain inaccuracy, a positional displacement error resulting from the inaccuracy is reduced to about ½ of the error which is caused if the intermediate sheet is registered with respect to only its leading end.

The above solution can be accomplished by an arrangement including the color image recording apparatus shown in FIG. 1, but using intermediate sheets each having two positioning marks on leading and trailing ends thereof, and another sensor holder which supports sensors for reading one of the positioning marks, the sensor holder being disposed in an exposure unit.

Figure 13:
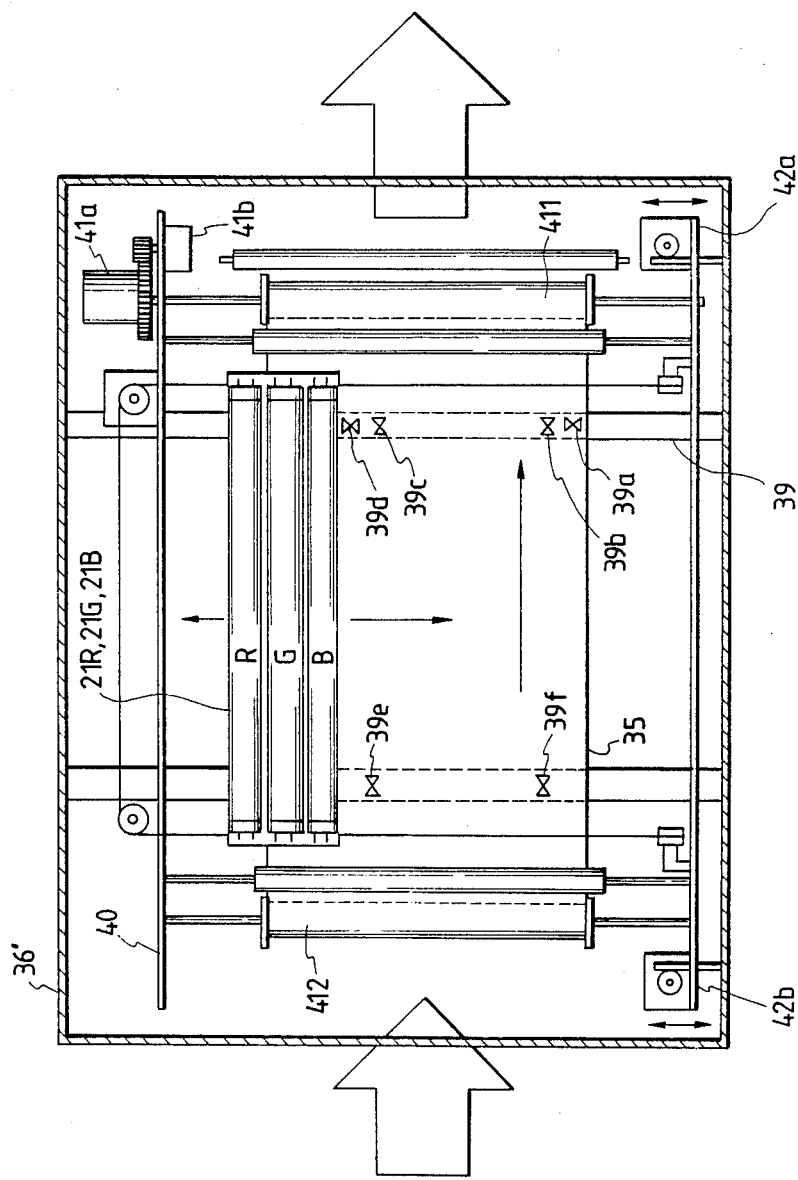
FIG. 13 is a plan view of an exposure unit for mask members each having positioning marks on front and rear ends thereof.

FIG. 13 schematically shows an exposure unit 36' constructed to achieve the above solution. Those parts of the exposure unit 36' which are identical to those of the exposure unit shown in FIG. 2 are denoted by identical reference numerals. The exposure unit 36' includes a sensor holder 39 fixed to an exposure unit frame, a pair of sensors 39a, 39d mounted on the sensor holder 39 and comprising reflective photoelectric sensors for reading a portion of a positioning mark 44a on the leading end of an intermediate sheet 22, which positioning mark portion extends in a direction perpendicular to the direction in which the intermediate sheet 22 is fed, a pair of sensors 39b, 39c mounted on the sensor holder 39 and comprising reflective photoelectric sensors for reading a portion of the positioning mark 44a on the intermediate sheet 22, which positioning mark portion extends in the direction in which the intermediate sheet 22 is fed a sensor holder 39' fixed to the exposure unit frame, and a pair of sensors 39e, 39f mounted on the sensor holder 39' and comprising reflective photoelectric sensors for reading a positioning mark 44b on the trailing end of the intermediate sheet 22, which positioning mark 44b extends in a direction perpendicular to the direction in which the intermediate sheet 22 is fed. The exposure unit 36' also includes a belt roller support unit 40 which supports rollers with an endless feed belt 35 trained therearound, a belt feed motor 41a for circularly moving the feed belt 35 at a high speed in the sheet feeding direction a belt inching motor 41b for rotating the belt feed motor 41a through small angles to inch the belt 35 at a low speed, and two belt moving motors 42a, 42b for independently moving the belt roller support unit 40 in the direction normal to the sheet feeding direction.

Figure 14:
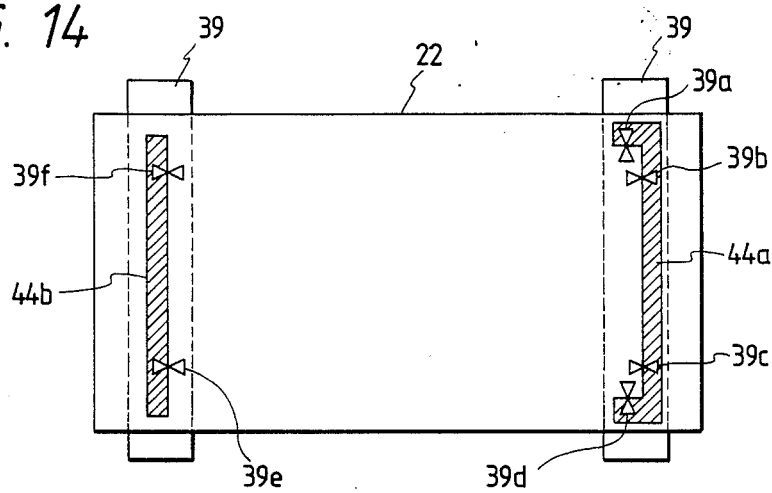
FIG. 14 is a plan view showing the relationship between positioning marks on a mask member shown in FIG. 13 and positioning sensors.

As shown in FIG. 14, the intermediate sheet 22 bears the positioning mark 44a on its lower surface at the leading end thereof. The positioning mark 44a will be read or detected by the sensors 39a, 39b, 39c, 39d. The intermediate sheet 22 also bears the positioning mark 44b on its lower surface at the trailing end thereof. The positioning mark 44b will be read or detected by the sensors 39e, 39f. The positioning mark 44b comprises a line extending in the direction normal to the sheet feeding direction. With each of the sensors used comprising a reflective photoelectric sensor, each of the positioning marks 44a, 44b should preferably have a width of 5 mm or more for reading the positioning marks without fail.

An intermediate sheet produced by the monochromatic laser beam printer 1 is fed into the exposure unit 36' in the same manner as described above with reference to the previous embodiments. In this embodiment, the exposure unit 36' has the belt feeding motor 41a and the belt inching motor 41b. However, only one motor may be used to feed and inch the belt under the control of a belt drive controller. The intermediate sheet which is electrostatically attracted to the belt by the electrostatic generating element is fed at a high speed into the exposure unit 36' by energizing the belt feeding motor 41a while locking or de-energizing the belt inching motor 41b, and thereafter is registered by energizing the belt inching motor 41b while looking or deenergizing the belt feeding motor 41a.

Figure 15:
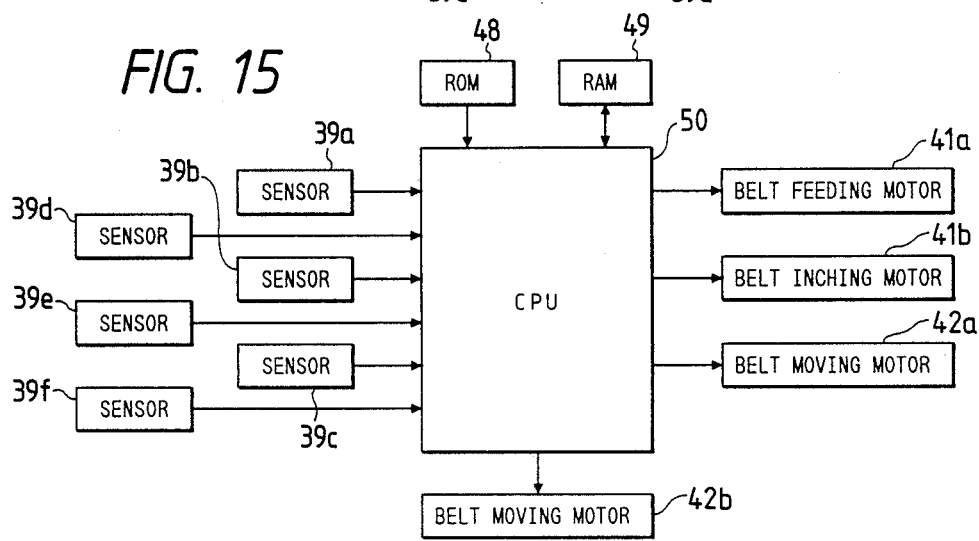
FIG. 15 is a block diagram of a belt drive controller for positioning mask members each having positioning marks on front and rear ends thereof.

FIG. 15 shows a belt drive controller for controlling the motors 41a, 41b, 41c. After the positioning mark 44a on the intermediate sheet 22R has been detected by the sensor 39b or 39c, output signals from the sensors 39a, 39b, 39c, 39d, 39e, 39f are applied to the microcomputer which is composed of the ROM 48, the RAM 49, and CPU 50 as shown in FIG. 15. Based on a control program stored in the ROM 48, the CPU 50 effects positioning calculations and controls the belt feeding motor 41a, the belt inching motor 41b and the belt moving motors 42m, 42b to feed the belt 35 and move the belt roller support unit 40. The intermediate sheet 22 is positionally corrected in the sheet feeding direction by the belt feeding motor 41a and the belt inching motor 41b, and is also positionally corrected in the direction normal to the sheet feeding direction by being moved the same interval by the belt moving motors 42a, 42b. The intermediate sheet 22 is also corrected out of a skewed condition by being differently moved by the belt moving motors 42a, 42b. As a result, the positioning marks 44a, 44b on the intermediate sheet 22 and an image thereon are registered in a highly specific position.

Figure 16:
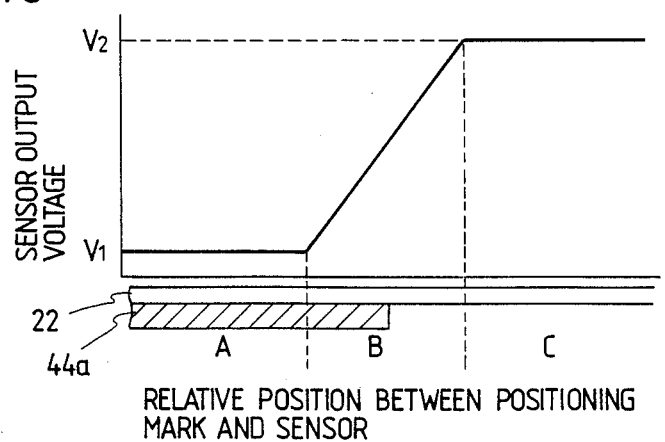
FIG. 16 is a diagram showing output signal characteristics of optical sensors in the belt drive controller illustrate in FIG. 15.

Details of the registering process for the intermediate sheet will be described in detail below. The output characteristics of each of the reflective photoelectric sensors 39a through 39f will be described with reference to FIG. 16. The graph of FIG. 16 has a vertical axis representing the output level of the sensor and a vertical axis the relative position of the sensor with respect to the positioning mark 44a on the intermediate sheet 22.

When the sensor 39a is in a positional range A and is detecting the positioning mark 44a, the sensor 39a produces a lower voltage V1. When the sensor 39a is in a positional range C and is not detecting the positioning mark 44a, the sensor 39a produces a higher voltage V2. When the sensor 39a is in a positional range in the vicinity of an edge of the positioning mark 44a, the sensor 39a produces a voltage which is intermediate between the voltages V1, V2 depending on the relative position of the sensor 39a. the other sensors 39b through 39f have the same output characteristics.

The intermediate sheet 22 is registered so that the sensors 39a, 39d, which detect lines on the opposite ends of the leading positioning mark 44a, produce the same output the sensors 39b, 39f, which detect respective corresponding first portions of the leading and trailing positioning marks 44a, 44b, produce the same output voltage which is intermediate between the voltages V1, V2, and the sensors 39c, 39e, which detect respective corresponding second portions of the leading and trailing positioning marks 44a, 44b, produce the same output voltage which is intermediate between the voltages V1, V2.

Figure 17:
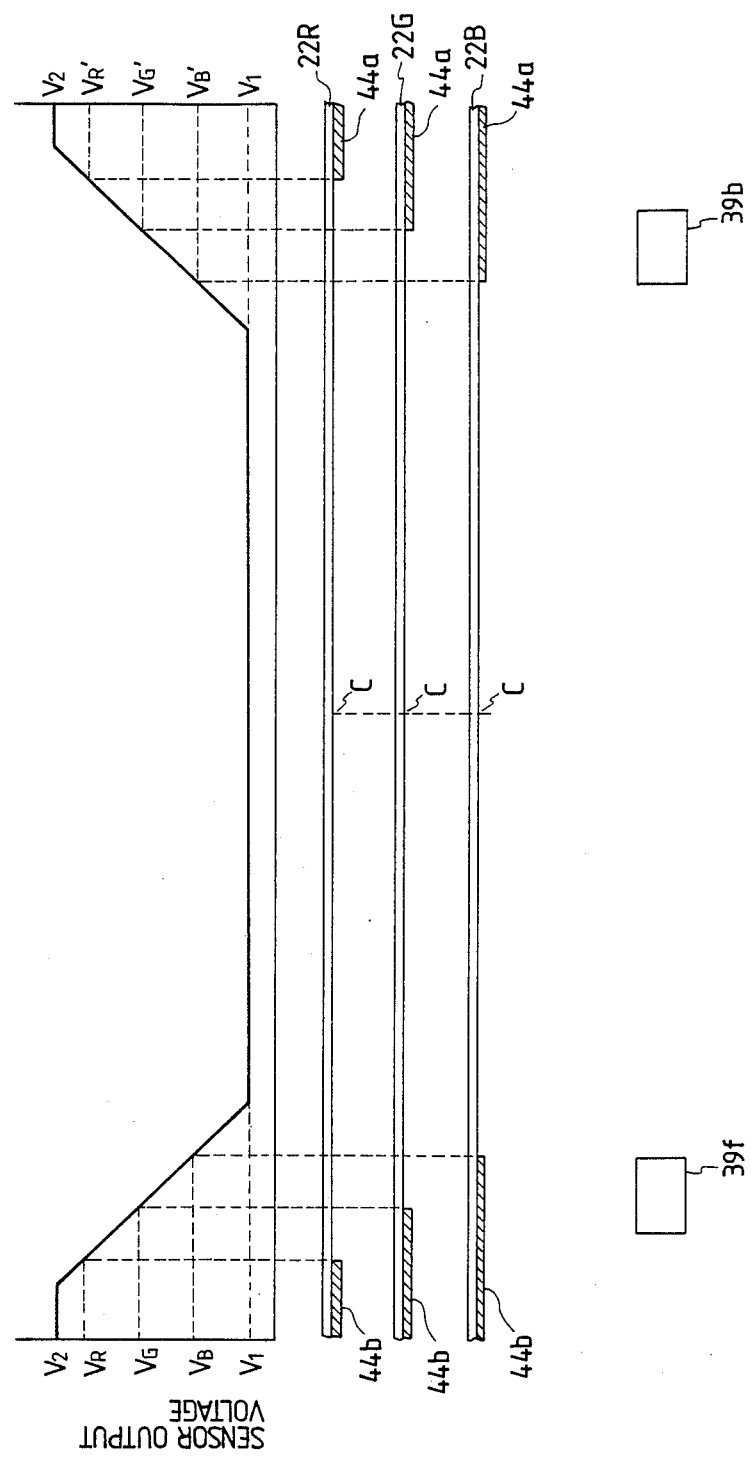
FIG. 17 is a diagram showing the relative positional relationship between the positioning marks and the optical sensors shown in FIG. 14 and the relationship between the positioning marks and output voltages of the optical sensors.

The above registering process will be described with reference to FIG. 17 which shows the sensors 39b, 39f, for example. The vertical axis of FIG. 17 indicates the output voltage of the sensors 39b, 39f, whereas the horizontal axis thereof the relative positions between the sensors 39b, 39f and the intermediate sheets 22R, 22G, 22B.

Each of the three intermediate sheets 22R, 22G, 22B bears printed positioning marks 44a, 44b on its leading and trailing ends. The positioning marks 44a, 44b are essentially positioned identically on any intermediate sheets, but may be slightly displaced as shown owing to inaccuracies of the intermediate sheets.

The intermediate sheets 22R, 22G, 22B are registered so that the following equations are met:

$$VR'/VR = VG'/VG = VB'/VB$$

where VR, VR' indicate output signals which are produced by the sensors 39f, 39b when they detect the marks 44a, 44b on the intermediate sheet 22R, VG, VG' indicate output signals which are produced by the sensors 39f, 39b when they detect the marks 44a, 44b on the intermediate sheet 22G, and VB, VB' indicate output signals which are produced by the sensors 39f, 39b when they detect the marks 44a, 44b on the intermediate sheet 22B. The intermediate sheets 22R, 22G, 22B are also registered similarly with respect to output signals from the other pairs of sensors 39a, 39d and 39c, 39e.

Through the above registering process, the three intermediate sheets 22R, 22G, 22B are registered with respect to the center C thereof between the positioning marks 44a, 44b. If the intermediate sheets 22R, 22G, 22B are registered with respect to the leading ends thereof, a color shift due to an error d resulting from inaccuracies of the intermediate sheets will appear as it is at the trailing ends thereof when the intermediate sheets 22R, 22G 22B are registered with respect to the center C thereof according to the above embodiment, however, the error is reduced to ½ at each of the leading and trailing ends of the intermediate sheets, and hence a reproduced image has a largely improved quality.

The feed belt which is employed in each of the aforesaid embodiments is in the form of a long sheet comprising a light transmissive dielectric material such as polyethylene terephthalate (PET), the ends of the sheet being joined by ultrasonic welding or the like to produce an endless belt.

The feed belt thus constructed has a seam at the joined ends The seam is less light transmissive than the rest of the belt. The seam may be overlapped by an intermediate sheet when the intermediate sheet is carried on the feed belt. Since the intensity of exposing light through the same is smaller than that through the rest of the feed belt, a resultant image bas a lower quality.

This problem can be solved by providing a reference mark for detecting the position of the seam of the feed belt on the feed belt itself and also an additional sensor for detecting such a reference mark. More specifically, the feed belt is held in a given position based on an output signal from the sensor which detects the reference mark for the seam of the feed belt. Then, an intermediate sheet is carried on the feed belt, and fed into the exposure position. By suitably selecting the given position, the seam of the feed belt may be controlled so that it will not enter an image area on the intermediate sheet.

Figure 18:
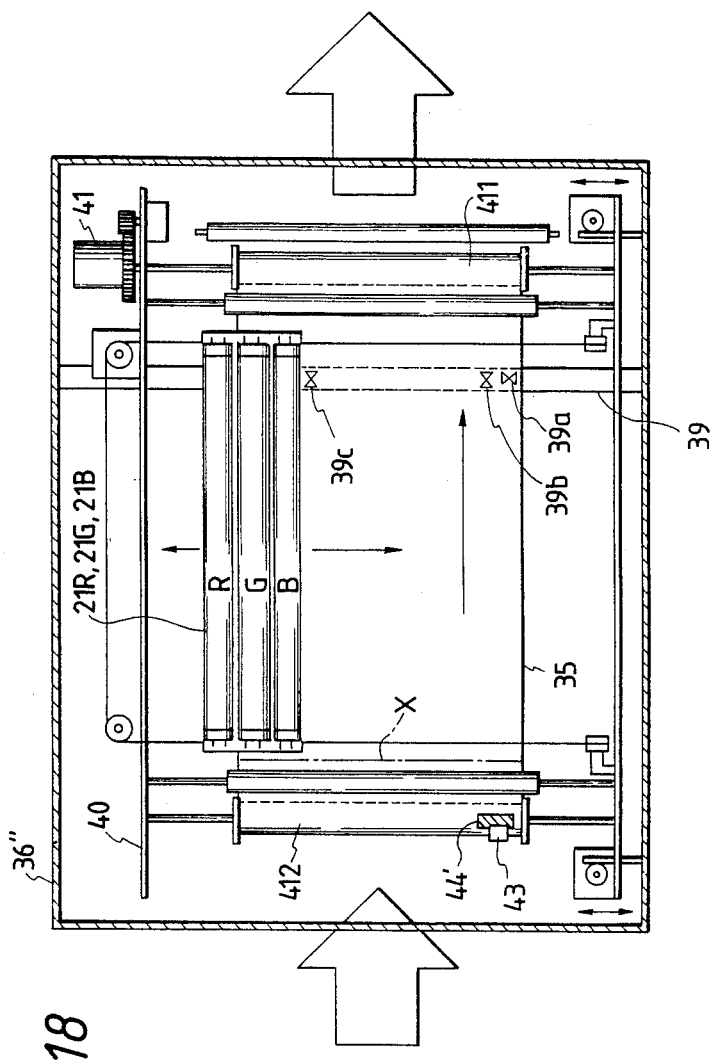
FIG. 18 is a plan view of an exposure unit having a reference mark for detecting a seam of an endless belt and a sensor for detecting the reference mark.

FIG. 18 shows an exposure unit which is constructed to solve the above problem. Those parts of FIG. 18 which are identical to those shown in FIGS. 2 and 3 are denoted by identical reference numerals The exposure unit, designated at 36″, has a reference mark 44′ on the feed belt 35 for detecting the position of the seam of the feed belt 35, and a sensor 43 for reading or detecting the reference mark 44′. The reference mark 44′ may be of any of various shapes, but should preferably have a width of 3 mm or more if it is rectangular in shape. The reference mark 44′ is positioned on the feed belt 35 depending on the position of the seam and the position of the sensor 43.

More specifically, if the sensor 43 is positioned near the positioning roller 34 (FIG. 1), then the reference mark 44′ is located as follows:

To prevent the seam X (FIG. 18) from entering the image area on the intermediate sheet upon exposure, the reference mark 44′ should be located slightly behind the seam X with respect to the direction in which the feed belt 35 is fed. With such an arrangement, when the sensor 43 detects the reference mark 44′, the feed belt 35 is stopped. At this time, the seam X is positioned slightly ahead Of the positioning roller 34. Then, an intermediate sheet 22 fed to the positioning roller 34 is electrostatically carried on the feed belt 35, and delivered into the exposure position Since the seam X is then positioned ahead of the image area on the intermediate sheet 22, the seam X does not enter the image area upon exposure.

If the sensor 43 is positioned in another location, the position of the reference mark 44′ is varied depending on the position of the sensor 43 so that the seam will not enter the image area on the intermediate sheet The reference mark 44′ may be positioned at any of desired locations insofar as it will not enter the image area upon exposure.

Figure 19:
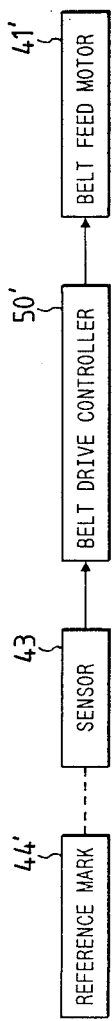
FIG. 19 is a block diagram showing the manner in which a detected signal from the sensor flows in the exposure unit shown in FIG. 18.

FIG. 19 show in block from a signal flow in an image recording apparatus which employs a microcomputer as a belt drive controller.

A belt drive controller 50' is a circuit for controlling the belt feed motor 41 (FIG. 18) and comprises a microcomputer.

Opening of the image recording apparatus is as follows:

The feed belt 35 is moved by the belt feed motor 41. At the time the sensor 43 detects the reference mark 44', the belt drive controller 50' stops the operation of the feed belt 35.

An intermediate sheet 22R produced by the monochromatic laser beam printer 1 passes through the intermediate sheet path selector 10 and, then, its leading edge is positioned by the intermediate sheet positioning roller 34. The intermediate sheet 22R is thereafter attracted to the feed belt 35 by the electrostatic generating element 38. By energizing the belt feed motor 41, the intermediate sheet 22R is fed into the exposure unit 36. The positioning mark is detected by the sensors 39a,39b,38c to accurately position the intermediate sheet 22R for exposure The sensor 43 comprises a reflective photoelectric sensor, but may comprise a transmissive photoelectric sensor provided it can detect the reference mark 44' on the feed belt 35. The belt drive controller 50' may be an electronic circuit composed of discrete elements rather than the microcomputer.

In the foregoing embodiments, a positioning mark is disposed at least on the leading end of an intermediate sheet, and the intermediate sheet is registered based on the positioning mark thus located. However, it is also possible to register an intermediate sheet by detecting a positioning mark on the trailing end of the intermediate sheet. Such a process is referred to as a time-operated process using first and second sensors which are spaced in the sheet feeding direction. After the leading end of the intermediate sheet has been directed by the first sensor a timer is operated. After elapse of the time set by the timer, the second is operated to register the intermediate sheet.

More specifically, to register the intermediate sheet in an exposure position, when the leading end of the intermediate sheet passes by the first sensor which is located before the exposure position, the timer is operated. After the time set by the timer has elapsed, the positioning mark on the trailing end of the intermediate sheet is detected by the second sensor. Which this process, however, it is necessary to very the time to be set by the timer depending on the size of the intermediate sheet. Unless the time to be set by the timer is properly selected, the second sensor tends to read an image portion rather than the positioning mark, resulting in an error. Malfunctions may also be caused if the rotational speed of the motor for feeding the intermediate sheet is irregular.

Figure 20:
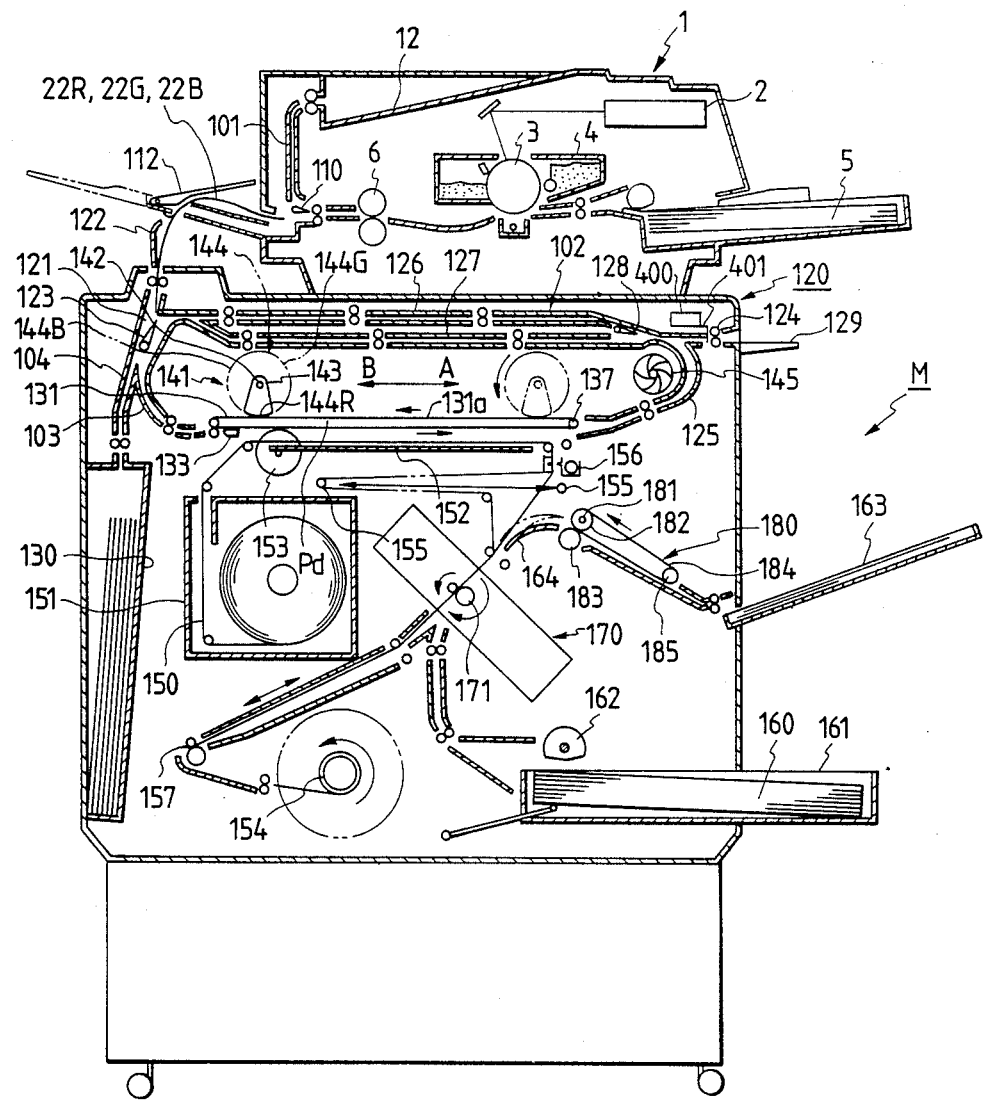
FIG. 20 is a vertical cross-sectional view of a color image recording apparatus according to another embodiment of the present invention.

FIG. 20 shows a color image recording apparatus 120 according to another embodiment of the present invention, which is designed to solve the above problem. Those parts of FIG. 20 which are identical to those shown in FIG. 1 are denoted by identical reference numerals. The monochromatic laser beam printer (intermediate sheet generator) 1 combined with the color image recording apparatus 120 is identical to the monochromatic laser beam printer shown in FIG. 1. However, the color image recording apparatus shown in FIG. 20 is different from that shown in FIG. 1, as follows:

When a black-and-white image is necessary, an intermediate sheet produced by the monochromatic laser beam printer 1 is delivered from a sheet passage 101 onto a sheet discharge tray 12 on an upper surface of the laser beam printer 1, or onto a sheet discharge tray 112 on a side of the laser beam printer by a sheet selector 110 in the laser beam printer 1. The sheet discharge tray 112 is foldable and can be unfolded to receive a black-and-white intermediate sheet thereon.

When a colored image is needed, the sheet discharge tray 112 is folded as shown in FIG. 20. Therefore, an intermediate sheet from the laser beam printer 1 is directed downwardly into the color image recording apparatus 120n by a guide plate 122. One set of three monochromatic intermediate sheets thus supplied is used as a set of mask members or intermediate sheets 22R, 22G, 22B in the color image recording apparatus 120.

The color image recording apparatus 120 includes an exposure unit 102 in its upper portion. The exposure unit 102 has an exposure device 141 which is reciprocally movable back and forth in the directions indicated by the arrows A,B. The exposure device 141 has a linear white light source 142 at its center. White light emitted from the light source 142 is reflected by a reflecting member 143 disposed near the light 142. A cylindrical color separation filter assembly 144 is disposed in surrounding relation to the white light source 142 and the reflecting member 143. The color separation filter assembly 144 comprises a red filter 144R, a green filter 144G, and a blue filter 144B which are successively arranged and joined together. The cylindrical color separation filter assembly 144 is rotatable about its own axis.

Below the exposure device 141, there is disposed a horizontal belt-shaped registering device 131 comprising an endless belt 131a made of a light transmissive dielectric material such as polyethylene terephthalate (PET) and trained around two rotational shafts. At least one of these rotatable shafts is rotatable about its own axis by motor (not shown) for circularly moving the belt 131 in the direction indicated by the arrow in FIG. 20. The surface of the belt 131a is electrically charged by a charging element (not shown) such as a corotron for electrostatically attracting an intermediate sheet 22. A sensor bar 133 (see FIG. 13) saving as a positioning mark detecting device is disposed below the lefthand end of the belt 131a.

An exposure table 152 is disposed below the registering device 131 in confronting relating thereto. The exposure table 152 is kept horizontally and movable vertically by a cam 153. A photosensitive recording medium 150 is positioned between the registering device 131 and the exposure table 152.

A circulatory passage for feeding the intermediate sheet 22 is disposed in surrounding relation to the area in which the exposure device 141 is reciprocally movable. The circulatory passage comprises an exposure feed passageway 103 for feeding the intermediate sheet 22 into an exposure position below the exposure device 141, a guide feed passageway 125 for guiding the intermediate sheet 22 which has been exposed, and vertically spaced first and second storage passageways 126, 127 which have righthand ends joined to the guide feed passageway 125 through a branch area which houses a selector 128. The intermediate sheet 22 which has been passed through the guide feed passageway 125 is sent into one of the first and second storage passageways 126, 127 by the selector 128.

A manual feed tray 129 extends horizontally from an upper portion of the casing of the color image recording apparatus 120 near the selector 128 on a front operator control side. The manual feed tray 129 is associated with two manual feed rollers 124 disposed in the apparatus casing and a shutter 401 openable and closable by a solenoid 400. If no other intermediate sheet is present in the storage passageways 126, 127 and the registering device 131, the shutter 410 is opened to guide an intermediate sheet supplied from the manual feed tray 129 into one of the storage passageways 126, 127. A cooling fan 145 for cooling the exposure device 141 is disposed inwardly of the guide feed passageway 125.

The upstream end of the exposure feed passageway 103 is connected to an upper end of a discharge feed passage 104 for discharging an intermediate sheet directly into a sheet discharge tray 130 which is disposed on the rear side of the color image recording apparatus 120 which is remote from the front operator control side. The two storage passageways 126, 127, the exposure feed passage 103, and the discharge feed passage 104 are joined by a branch area in which there is disposed an angularly movable passage selector 123 for selecting a passage for the intermediate sheet 22.

The photosensitive recording medium 150 is mainly made of photosetting resins including a photopolymerization initiator which is known from Japanese Laid-Open Patent Publication No. 62-143044, for example. The photosensitive recording medium 150 comprises a base coated with microcapsules containing photosetting resins which be set upon exposure to red, green, and blue lights, and dye precursors of cyan, magenta, and yellow. The photosensitive in a cartridge 151. The photosensitive recording medium 150 which is unreeled from the cartridge 151 passes between the belt 131a and the exposure table 152, travels through a fixed roller 156 for gripping the photosensitive recording medium 150 in a fixed position, a tensioner 155 which is horizontally reciprocally movable to take up any sag from the photosensitive recording medium 150, a movable guide 164 for guiding a color developer sheet after an image has been developed thereon, a pressure developing unit 170 for pressing the photosensitive recording medium 150 having a latent image thereon and a color developer sheet against each other to transfer the latent image from the photosensitive recording medium 150 as a developed image to the color developer sheet, and a drive roller 157 disposed below the cartridges 151 for withdrawing the photosensitive recording medium 150 from the cartridge 151, and is bound around takeup roller 154. When the photosensitive recording medium 150 is exposed to light from the exposure device 141, the exposure table 152 is elevated by the cam 153 to bring the intermediate sheet 22 fed by the belt 131a into intimate contact with the photosensitive recording medium 150. While the latent image is being developed by the pressure developing unit 170, the fixed roller 156 grips the exposed photosensitive recording medium 150 securely in a fixed position, and the tensioner 155 prevents the photosensitive recording medium 150 from sagging. The drive roller 157 serves to feed the photosensitive recording medium 150 at a constant speed.

The color developer sheet 160 comprises a base of paper coated on one surface with a color developer disclosed in Japanese Laid-Open Patent Publication No. 58-88739, for example. A stack of such color developer sheets 160 is stored, with coated sides down, in a cassette 161 disposed in a lower portion of the casing of the color image recording apparatus 120 on the front operator control side. The color developer sheets 160 are taken, one at a time, from the cassette 161 by a feed roller 162 which is intermittently driven by a drive source (not shown), and supplied to the pressure developing unit 170. The supplied color developer sheet 160 and the exposed photosensitive recording medium 150, which are held against each other, are pressed by a pair of pressing rollers 171 of the pressure developing unit 170, so that a latent image formed on the photosensitive recording medium 150 by exposure is visualized on the color developer sheet 160.

The color developer sheet 160 with the developed image is guided into a thermal fixing unit 180 disposed above the cassette 161. The thermal fixing unit 180 comprises a heat roller 182 with a heater 181, an endless belt 184 trained around the heat roller 181 and the auxiliary roller 185, and presser roller 183 pressed against the heat roller 182 through the endless belt 184. The color developer sheet 160 guided from the pressure developing unit 170 by the movable guide 164 is calendared by the thermal fixing unit 180. after which the color developer sheet 160 is discharged onto a sheet discharge tray 163 supported on the casing of the color image recording apparatus 120 on the front operator control side.

A plurality of sensors for detecting an intermediate sheet 22 are disposed along the circulatory passage for feeding the intermediate sheet 22. More specifically, as shown in FIG. 22, these sensors include a sensor S1' near the guide plate 122 for detecting an intermediate sheet 22 is it travels from the monochromatic laser beam printer into the color image recording apparatus 120, a sensor S2' near the first storage passage 126 for detecting an intermediate sheet 22 in the first storage passageway 126 for detecting an intermediate sheet 22 in the first storage passageway 126, a sensor S3' near the second storage passageway 127 for detecting an intermediate sheet 22 in the second storage passageway 127, a sensor S4' near the manual feed rollers 124 for detecting an intermediate sheet 22 as it is inserted from the manual feed tray 129, a sensor S5' near the guide feed passage 125 for detecting an intermediate sheet 22 therein, a sensor S6' near the exposure feed passage 103 for detecting an intermediate sheet 22 therein, and a sensor S7' near the discharge feed passage 104 for detecting an intermediate sheet 22 therein.

Figure 21:
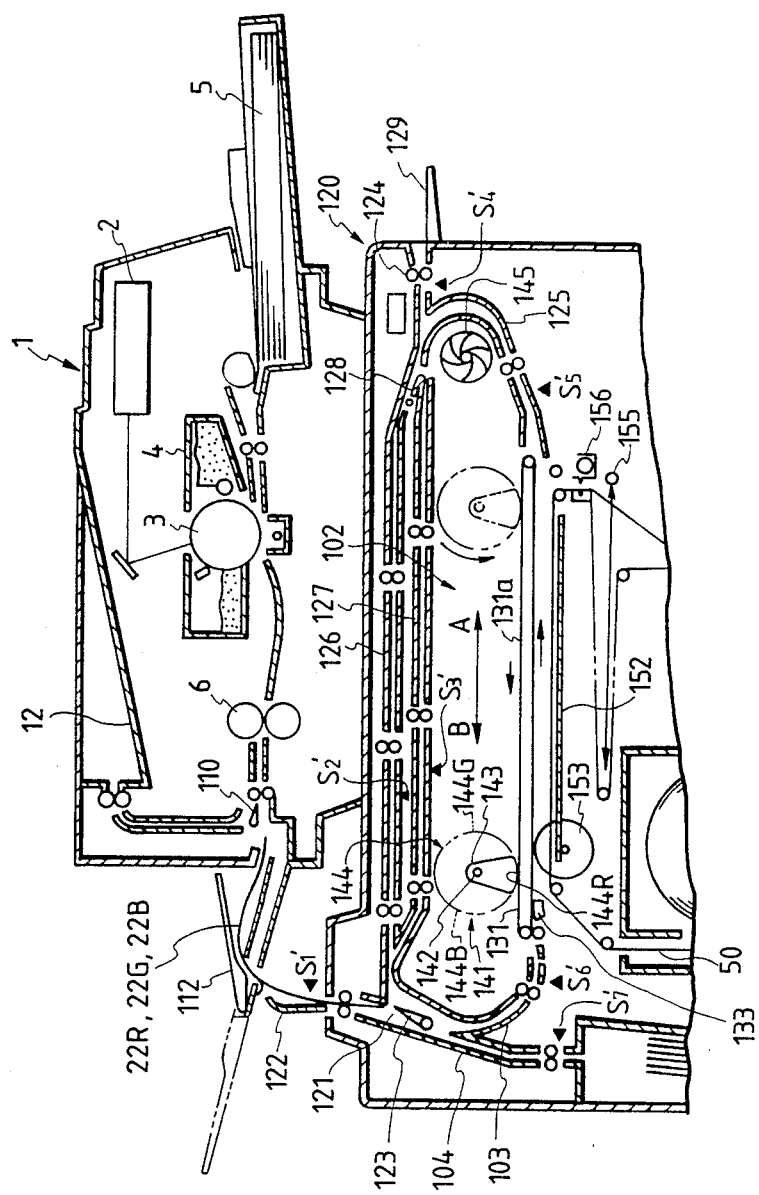
FIG. 21 is a fragmentary vertical cross-sectional view showing an upper portion of the color image recording apparatus of FIG. 20.

As shown in FIGS. 20 and 21, the sensor bar 133 is positioned at one end (lefthand end as shown) of an exposure positioned pd in the exposure unit 102 and below the registering device 131. The sensor bar 133 extends transversely of the registering device 131 as shown in FIG. 23. The sensor bar 133 supports thereon five, for example, optical sensors S40, S41, S42, S43, S44. Each intermediate sheet 22 has four marks m40, m41, m42, m43 on its trailing end with respect to the direction in which it is fed. The mark m40, which is of a rectangular shape, and the mark m43, which is of hooked shaped, serve as positioning marks, whereas the other marks m41, m42, which are smaller and rectangular, serve, for example, as color marks indicating the color of an image (R, G, B) on the intermediate sheet, or size marks indicating the size of the intermediate sheet. The sensors S40, S43, S44 are positioned so that they detect the positioning marks m40, m43, and the sensors S41, S42 are positioned so that they detect the marks m41, m42. While the intermediate sheet 22 is being electrostatically attracted to the belt 131a of the registering device 131, the marks m40 through m43 are detected by the sensors S40 through S44, and the registering device 131 is moved in the directions indicated by the arrows X, Y by a drive device (not shown) in order to register the intermediate sheet 22.

Another sensor S6' serving as an intermediate sheet detector for detecting the passage of an intermediate sheet is disposed upstream of the sensor bar 133 with respect to the direction in which the intermediate sheet 22 is fed. As illustrated in FIGS. 22 and 23, the sensor S6' comprises a light-emitting diode, phototransistor, and an actuator 300 for cutting off light emitted from the light-emitting diode toward the phototransistor thereby to detect the presence of an intermediate sheet. More specifically, the sensor S6' has a rectangular casing 301 having a groove 302 defined therein, with the light-emitting diode and the phototransistor being disposed in the casing 301 one on each side of the groove 302. The actuator 800 comprises two angularly spaced arms 300a, 300b pivotally mounted in the groove 302 and normally urged by a spring in a direction to project out of the groove 302. While an intermediate sheet 22 is passing by the sensor S6', the arm 300b is held in the groove 302. When the intermediate sheet 22 has moved past the sensor S6', the arm 300b jumps out of the groove 302.

The sensor S6' is preferably located closely to the sensor bar 133. As shown in FIG. 24, when the sensor S6' detects the passage of the trailing end of an intermediate sheet 22 which carries the marks in a step S1' the sensor S6' sends an operating signal to the sensor bar 133 to enable the sensors thereon to detect the marks on the intermediate sheet 22 in a step S2.

If the sensor S6' cannot be positioned near the sensor bar 133 because of structural limitations of the exposure unit 102, then the sensor S6' and the sensor bar 133 are necessarily spaced somewhat from each other in this case, as shown in FIG. 25, when the sensor S6' detects the passage of the trailing end of an intermediate sheet 22 in a step S1, a timer is operated in a step S2, and after elapse of the time set by the timer and corresponding to the distance between the sensor S6' and the sensor bar 133, the sensors on the sensor bar 133 are enabled in a step S3.

Since the sensors on the sensor bar 133 are enabled in response to detection of the passage of the trailing end of an intermediate sheet 22, the image on the intermediate sheet 22 is not erroneously detected by the sensors on the sensor bar 133, and the size of the intermediate sheet 22 has no effect on the sensors. Errors in detection timing are small as the sensor S6' and the sensor bar 133 are closely spaced from each other.

The intermediate sheet generator 1 is not limited to a monochromatic laser beam printer, but may comprise an LED printer a liquid crystal printer, a thermal printer, or the like insofar as it can generate intermediate sheets or mask members of three primaries (R, G, B).

If the intermediate sheet generator 1 is in the form of a desktop printer, then it can be placed on and connected to the color image recording apparatus 20, so that intermediate sheets of three primaries can be fed directly from the printer into the color image recording apparatus. If the intermediate sheet generator 1 is in the form of a larger printer, intermediate sheets of three primaries which are generated thereby may be manually inserted one by one from the manual feed tray into the color image recording apparatus.

In the foregoing embodiments, the photosensitive pressure-sensitive sheet and the color developer sheet are combined to form colored images. Morever, a sheet having the functions of both these sheets may be employed to form colored images.

The positioning marks may be of any of various shapes providing they an be read by the sensors and are positioned in exact relationship to images on intermediate sheets.

The feed belt for feeding intermediate sheets may not be an endless belt, but may be a rolled belt. As described above, the belt drive controller may comprise an electronic circuit composed of discrete element rather than a microcomputer.

In the illustrated embodiments, three intermediate sheets 22R. 22G, 22B of three primaries are employed as one set to form a colored image. However, the number of colors and intermediate sheets to be used may be selected as desired. For example, four intermediate sheets, such as intermediate sheets of three primaries and in intermediate sheet of black, may be used as one set.

Although certain preferred embodiments have been shown and described, it should be understood that many changes and modifications may be made therein without departing from the scope of the appended claims.

What is claimed is:

1. A color image recording device for forming a mask member having a positioning mark thereon on the basis of an input color image and exposing a photosensitive medium through the mask member to light to form a color image on the photosensitive medium comprising:

belt means for carrying the mask member thereon;

belt moving means for supporting and moving said belt means, said belt moving means mounted in said color image recording device so as to be movable relative to said color image recording device;

driving means for driving said belt moving means so that said belt means is movable in a feeding direction of the mask member and in a vertical direction to the feeding direction, said driving means comprising first motor means for registering the mask member in the feeding direction and second motor means for registering the mask member in the vertical direction to the feeding direction and correcting the inclination of the mask member to the feeding direction;

position detecting means for detecting the positioning mark and outputting a signal representing the position of the mask member; and control means for controlling said driving means to change a feeding speed of said belt moving means at two or more states in accordance with the signal from said position detecting means, so that the mask member is roughly fed at a high speed and is finely registered at a low speed.

2. A color image recording device as claimed in claim 1, wherein said first and second motor means comprise stepping motors and wherein the changing operation of the feeding speed is performed for each of said stepping motors by switching the excited phases of said stepping motors.

3. A color image recording device as claimed in claim 2, wherein said stepping motors are energized by a 2-2 phase system at a high speed operation and by 1-2 phase system at a low speed operation.

4. A color image recording device as claimed in claim 1, wherein said first and second motor means comprise stepping motors and wherein said control means includes a driving motor circuit for supplying an electric power to each of said stepping motors, said driving motor circuit changing the electric power supplied to at least one of said stepping motors at three or more levels.

5. A color image recording device for forming a mask member having a positioning mark thereon on the basis of an input color image and exposing a photosensitive medium through the mask member to light to form a color image on the photosensitive medium, comprising:
  belt means for carrying the mask member thereon;
  belt moving means for supporting and moving said belt means, said belt moving means mounted in said color image recording device so as to be movable relative to said color image recording device;
  driving means for driving said belt moving means so that said belt means is movable in a feeding direction of the mask member and in a vertical direction to the feeding direction, said driving means comprising first motor means for registering the mask member in the feeding direction and second motor means for registering the mask member in the vertical direction to the feeding direction and correcting the inclination of the mask member to the feeding direction;
  position detecting means for detecting the positioning mark and outputting a signal having a level indicative of the position of the mask member; and
  control means for judging the position of the mask member on the basis of the signal from said position detecting means and controlling the driving speed and driving direction in accordance with the result of judgement of said control means.

6. A color image recording device as claimed in claim 5, wherein said control means controls said driving means to stop moving said belt moving means when judging the mask member to be at a predetermined position and to proceeding or returning said belt moving means by a predetermined amount when judging the mask member not to be at the predetermined position.

7. A color image recording device as claimed in claim 6, wherein said first and second motor means comprise stepping motors and said predetermined amount is a moving amount corresponding to one step of each of said stepping motors.

8. A color image recording device as claimed in claim 5, wherein said control means includes comparison means for comparing the level of the signal from said position detecting means with each of at least two threshold levels, judging from the comparative result whether the mask member is positioned at a predetermined position and controlling said driving means to proceeding or returning said belt moving means by a predetermined amount when judging the mask member not be at the predetermined position.

9. A color image recording device as claimed in claim 8, wherein said first and second motor means comprise stepping motors and said predetermined amount is a moving amount corresponding to one step of each of said stepping motors.

10. A color image recording device as claimed in claim 5, wherein said belt moving means comprises first and second belt moving means spaced at a predetermined interval and independently movable in the vertical direction to the feeding direction of the mask member, said second motor means comprises third and fourth motor means for moving said first and second belt moving means, respectively and said position detecting means comprises first to third position detecting means for independently detecting the position of the mask member in the feeding direction, the position of said first belt moving means and the position of said second belt moving means, respectively, and wherein said control means controls said first, third and fourth motor means simultaneously and parallel in accordance with output signals of said first to third position detecting means to thereby independently correct the positional deviations of the feeding direction of the mask member and the moving direction of said first and second belt moving means.

11. A color image recording device for forming a mask member having a positioning mark on the basis of an input color image and exposing a photosensitive medium through the mask member to light to form a color image on the photosensitive medium, comprising:
  belt means for carrying the mask member thereon;
  belt moving means for supporting and moving said belt means, said belt moving means mounted in said color image recording device so as to be movable relative to said color image recording device;
  driving means for driving said belt moving means so that said belt means is movable in the feeding direction of the mask member and in the vertical direction to the feeding direction;
  position detecting means for detecting the positioning mark and outputting a signal indicative of the position of the mask member; and
  control means for controlling said driving means in accordance with the signal from said position detecting means to register the mask member,
  wherein the mask member is provided with first and second positioning marks at least at one end portion of the mask member and the other end portion thereof, respectively, and said position detecting means includes a first positioning sensor for detecting said first positioning mark and outputting a first analog signal indicative of the position of said first positioning mark and a second positioning sensor for detecting said second positioning mark and outputting a second analog signal indicative of the position of said second positioning mark.

12. A color image recording device as claimed in claim 11, wherein said first and second positioning marks are provided at the front and rear end portions of the mask member in the feeding direction of the mask member, respectively.

13. A color image recording device as claimed in claim 11, wherein said control means monitors the ratio in level of said first and second analog signals and controls said driving means so that the ratio is equal to a predetermined value.

14. A color image recording device for forming a mask member having a positioning mark formed at the rear end portion thereof in a feeding direction of the mask member and exposing a photosensitive medium through the mask member to light to form a color image on the photosensitive medium, comprising:
  belt means for carrying the mask member thereon;
  belt moving means for supporting and moving said belt means, said moving means mounted in said color image recording device so as to be movable relative to said color image recording device;
  driving means for driving said belt moving means so that said belt means is movable in the feeding direction of the mask member and in the vertical direction to the feeding direction;

position detecting means for detecting the positioning mark and outputting a signal indicative of the position of the mask member;

mask end detecting means provided at the upstream side of the feeding direction of said position detecting means for detecting the rear end of the mask member; and control means for controlling said position detecting means to start a position detecting operation of said position detecting means after the rear end of the mask member is detected by said mask end detecting means. and controlling said driving means in accordance with the signal from said position detecting means.

15. A color image recording device as claimed in claim 14, wherein said mask end detecting means comprise a light emission unit for emitting a light, a photosensing unit for detecting the light from said light emission unit, said light emission unit and said photosensing unit defining a light channel, and an actuator for interrupting the light channel when said mask end detecting means detects the mask member and releasing the interruption of the light channel when said mask end detecting means detects the rear end of the mask member.

16. A color image recording device as claimed in claim 15, wherein said light emission unit and said photosensing unit comprise a light-emitting diode (LED) and a phototransistor, respectively.

17. A color image recording device as claimed in claim 15, wherein said control means controls said position detecting means to start a position detecting operation thereof after a predetermined time is lapsed from detection of the rear end of the mask member.

18. A color image recording device for forming a mask member having a positioning mark and exposing a photosensitive medium through the mask member to light to form a color image on the photosensitive medium comprising:

belt means having an endless belt for carrying the mask member thereon;

belt moving means for supporting and moving said belt means, said belt moving means mounted in said color image recording device so as to be movable relative to said color image recording device;

driving means for driving said belt moving means so that said belt means is movable in the feeding direction of the mask member and in the vertical direction to the feeding direction;

position detecting means for detecting the positioning mark and outputting a first signal indicative of the position of the mask member;

joint detecting means for detecting a joint position of said endless belt and outputting a second signal indicative of the position of the joint portion; and control means for controlling said driving means to prevent the mask member from being superposed on the joint portion in accordance with the second signal and to register the mask member in accordance with the first signal.

* * * * *